US012764984B2

(12) United States Patent
Hu et al.

(10) Patent No.: US 12,764,984 B2
(45) Date of Patent: Oct. 13, 2026

(54) SEMICONDUCTOR DEVICE WITH FIELD PLATE AND MULTIPLE-PART GATE STRUCTURE AND METHOD OF FABRICATION THEREFOR

(71) Applicant: NXP USA, Inc., Austin, TX (US)

(72) Inventors: Jie Hu, Chandler, AZ (US); Bernhard Grote, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 656 days.

(21) Appl. No.: 18/324,108

(22) Filed: May 25, 2023

(65) Prior Publication Data

US 2024/0395872 A1 Nov. 28, 2024
US 2026/0282411 A2 Sep. 17, 2026

(51) Int. Cl.
*H10D 30/01* (2025.01)
*H10D 64/00* (2025.01)

(52) U.S. Cl.
CPC ......... *H10D 30/015* (2025.01); *H10D 64/112* (2025.01)

(58) Field of Classification Search
CPC .. H10D 64/112; H10D 30/015; H10D 64/518; H10D 64/111; H10D 30/475
See application file for complete search history.

(56) References Cited

U.S. PATENT DOCUMENTS 6,867,078 B1 3/2005 Green et al.
7,592,211 B2 9/2009 Sheppard et al.
7,709,269 B2 5/2010 Smith et al.
8,049,252 B2 11/2011 Smith et al.
9,847,411 B2 12/2017 Sriram et al.
2022/0302306 A1* 9/2022 Tailor ................ H10D 84/0177
2023/0124686 A1 4/2023 Renaud et al.
2024/0222442 A1 7/2024 Grote et al.

OTHER PUBLICATIONS

Orbit search history.*
Bothe et al: "Improved X-Band Performance and Reliability of a GaN HEMT With Sunken Source Connected Field Plate Design", IEEE Electron Device Letters ( vol. 43, Issue: 3, Mar. 2022), pp. 354-357.

(Continued)

*Primary Examiner* — Changhyun Yi
(74) *Attorney, Agent, or Firm* — Sherry W. Gourlay

(57) ABSTRACT

A semiconductor device includes a semiconductor substrate, source and drain electrodes, lower dielectric layer(s) disposed over an upper surface of the semiconductor substrate, and intermediate dielectric layer(s) disposed over the lower dielectric layer(s). The device also includes a multiple-part gate structure with lower and upper gate electrodes. The lower gate electrode is formed from a first portion of a first conductive layer. The upper gate electrode is formed from a second conductive layer. The device further includes a lower field plate disposed between the lower gate electrode and the drain electrode. The lower field plate is formed from a second portion of the first conductive layer. Methods of forming the semiconductor device enable the lower gate electrode and the lower field plate to be created in a self-aligned manner.

14 Claims, 16 Drawing Sheets

(56) References Cited

OTHER PUBLICATIONS

Denninghoff et al.: "Design of High-Aspect-Ratio T-Gates on N-Polar GaN/AlGaN MIS-HEMTs for High fmax", IEEE Electron Device Letters ( vol. 33, Issue: 6, Jun. 2012), pp. 785-787.
Elkashlan et al.: "Analysis of Gate-Metal Resistance in CMOS-Compatible RF GaN HEMTs" IEEE Transactions on Electron Devices, Year: 2020 , vol. 67, Issue: 11, Nov. 11, 2020, 5 pages.
U.S. Appl. No. 17/561,796; not yet published; 51 pages (Dec. 24, 2021).
U.S. Appl. No. 17/645,280; not yet published; 37 pages (Dec. 20, 2021).
U.S. Appl. No. 17/645,290; not yet published; 32 pages; (Dec. 20, 2021).
U.S. Appl. No. 18/147,972; not yet published 122 pages (Dec. 29, 2022).

* cited by examiner

SEMICONDUCTOR DEVICE WITH FIELD PLATE AND MULTIPLE-PART GATE STRUCTURE AND METHOD OF FABRICATION THEREFOR

TECHNICAL FIELD

Embodiments of the subject matter described herein relate generally to semiconductor devices, and methods for fabricating such devices.

BACKGROUND

Semiconductor devices find application in a wide variety of electronic components and systems. For example, high power, high frequency transistors find application in radio frequency (RF) systems and power electronics systems. Gallium nitride (GaN) device technology is particularly well suited for these RF power and power electronics applications due to its superior electronic and thermal characteristics. In particular, the high electron velocity and high breakdown field strength of GaN make devices fabricated from this material ideal for RF power amplifiers and high-power switching applications.

GaN heterojunction field effect transistors (HFETs) include ohmic source and drain electrodes at opposite ends of a channel, with a gate electrode positioned above the channel between the source and drain electrodes. In addition, some GaN HFETs include a field plate to enhance the performance and reliability of the transistors.

Characteristics of a GaN HFET that affect performance include gate resistance and gate-to-drain capacitance. Generally, it is desirable for the gate resistance and the gate-to-drain capacitance to be as low as possible for any given GaN HFET design, in order to achieve relatively high gain and relatively low memory effects (e.g., improved charge trapping).

One way to lower gate-to-drain capacitance is to reduce the space (distance) between the gate metal and the field plate. However, using conventional manufacturing methods, there is a limit to how short the gate-to-field plate spacing can be without these two features merging together during fabrication. Accordingly, there is a need for semiconductor devices (e.g., GaN HFETs) with smaller gate-to-field plate spacing and methods of their fabrication.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
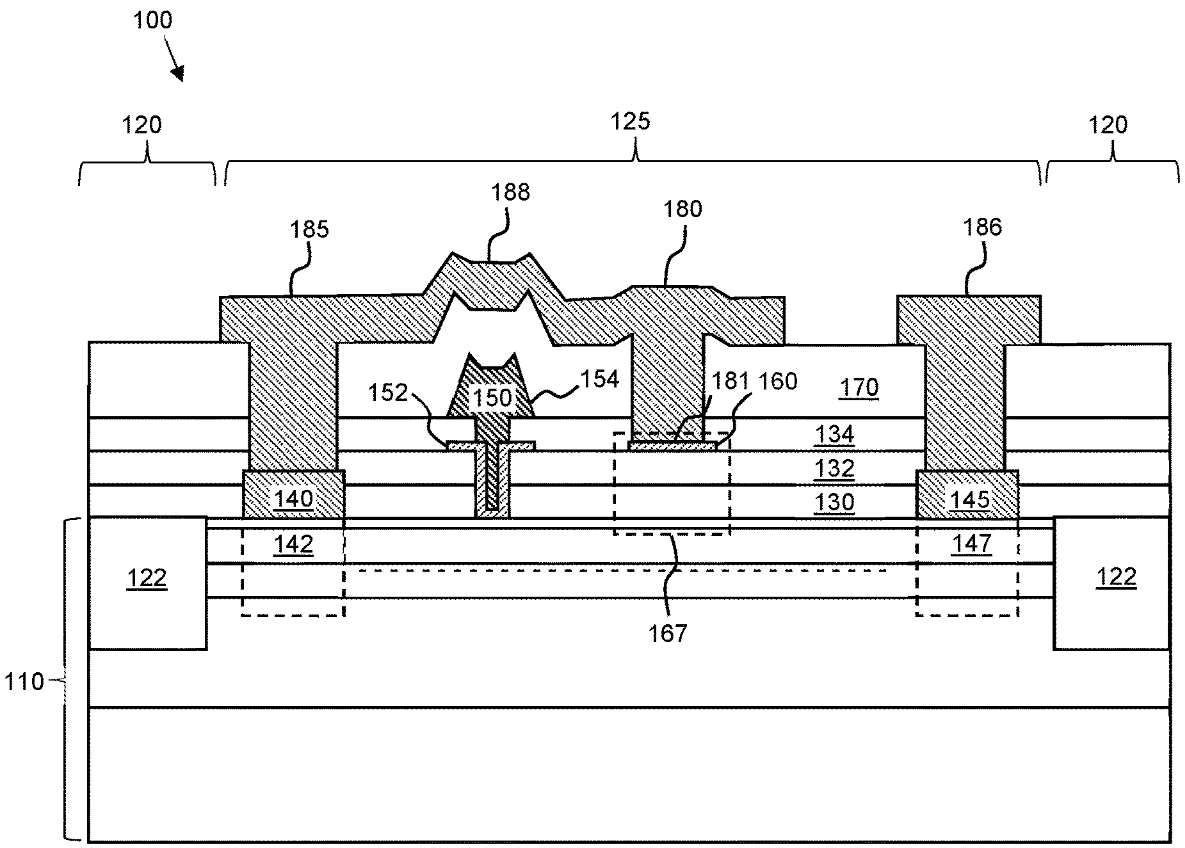
FIG. 1 is a cross-sectional, side view of an exemplary transistor, in accordance with an embodiment.

Embodiments of the inventive subject matter described herein include semiconductor devices and methods of their fabrication. More specifically, semiconductor devices (e.g., transistor devices) are described herein which include a multiple-part gate structure and a field plate. The multiple-part gate structure includes lower and upper gate electrodes. The lower gate electrode is formed from a first portion of a first conductive layer, which includes a first segment that extends through a first gate opening in one or more lower dielectric layers, and a second segment that overlies the lower dielectric layer(s) and extends from the first gate opening toward a drain electrode. The upper gate electrode is formed from a second conductive layer. The upper gate electrode extends through one or more intermediate dielectric layers (which overlie the lower dielectric layer(s)) to contact the lower gate electrode. The field plate is disposed between the lower gate electrode and the drain electrode, and the field plate is formed from a second portion of the first conductive layer. In various embodiments, the field plate and the lower gate electrode are self-aligned, as described in detail below.

Fabrication methods disclosed herein enable transistor designs with self-aligned field plates and gate electrodes, relatively low gate resistance, and relatively low gate-to-drain capacitance, when compared with conventional devices. Self-aligned field plates and gate electrodes are made possible by defining these features using a single photoresist mask. Fabrication methods disclosed herein allow for the fabrication of transistors (e.g., GaN HFETs) with reduced gate-to-field plate spacing (and thus reduced gate-to-drain capacitance), in comparison with conventional devices. Accordingly, transistor designs having the below-described features and/or fabricated with the below-described fabrication methods may be characterized by relatively high gain and relatively low memory effects (e.g., improved charge trapping). As will be described below, the field plate may have lower and upper portions, and in some embodiments, the relative positions of the lower and upper field plate portions are adjusted in order to reduce the electric field at the drain-side edge of the lower field plate (e.g., adjustments are made to the distance that the upper field plate extends beyond the drain-side edge of the lower field plate). This may improve dielectric reliability and improve breakdown voltage of the device.

Although examples of the various embodiments are described below with respect to gallium nitride (GaN) heterojunction field effect transistor (HFET) devices (e.g., devices 100, 100', 100", 100''', FIGS. 1, 24, 26, 29), it should be noted that the various embodiments may be utilized in other types of transistors, transistors that have semiconductor substrates that do not include GaN (i.e., non-GaN-based transistors), and other types of non-transistor semiconductor devices that include features that benefit from reduced gate-to-field plate spacing. Accordingly, the various embodiments described herein are not limited to GaN HFET devices, but instead include transistors other than HFET transistors, non-GaN-based transistors, and semiconductor devices other than transistors.

FIG. 1 is a cross-sectional, side view of an exemplary GaN HFET device 100, in accordance with one or more embodiments. GaN HFET device 100 includes a semiconductor substrate 110, one or more isolation regions 120, an active region 125, first, second, third, and fourth dielectric layers 130, 132, 134, 170, a source electrode 140 (i.e., "first current-carrying electrode"), a drain electrode 145 (i.e., "second current-carrying electrode"), a gate structure 150 (i.e., "control electrode"), and a field plate 160. Various additional patterned conductive layers and dielectric layers (not shown) may be formed over dielectric layer 170 to provide for interconnection with bonding pads and other circuit elements.

The semiconductor substrate 110 may include a host substrate 102, a buffer layer 104 disposed on or over the host substrate 102, a channel layer 106 disposed on or over the buffer layer 104, a barrier layer 108 disposed on or over the channel layer 106, and an optional cap layer 109 disposed on or over the channel layer 106. A channel 107 is created in the form of a two-dimensional electron gas (2-DEG) within the channel layer 106 near the interface between the channel layer 106 and barrier layer 108.

In one or more embodiments, the host substrate 102 may include silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. A nucleation layer (not shown) may be formed on an upper surface of the host substrate 102 between the buffer layer 104 and the host substrate 102. In an embodiment, the nucleation layer may include AlN.

Without departing from the scope of the inventive subject matter, it should be appreciated that the choice of materials and arrangement of layers to form the semiconductor substrate 110 is exemplary. It should be appreciated that the inclusion of the host substrate 102, the buffer layer 104, the channel layer 106, the barrier layer 108, and the cap layer 109 into the semiconductor substrate 110 is exemplary and that the function and operation of the various layers may be combined and may change depending on the materials used in any specific embodiment. For example, in some embodiments, the cap layer 109 may be omitted. In other embodiments using N-polar materials, the channel layer 106 may be disposed on or over the barrier layer 108 to create a 2-DEG and channel 107 directly beneath the cap layer 109 and the gate structure 150. Still further embodiments may include semiconductor layers formed from materials including GaAs, gallium oxide ($Ga_2O_3$), aluminum gallium arsenide (AlGaAs), indium gallium arsenide (InGaAs), and aluminum indium arsenide (AlInAs) to form the semiconductor substrate 110.

High resistivity regions 122 may be formed in the semiconductor substrate 110 to define isolation regions 120 and an active region 125 above and along the upper surface 103 of the host substrate 102, according to an embodiment.

In various embodiments, multiple dielectric layers 130, 132, 134, 170 may be formed on or over the active region 125 and isolation regions 120. Dielectric layers 130 and 132 may be referred to herein as "one or more lower dielectric layers." Dielectric layer 134 may be referred to herein as "one or more intermediate dielectric layers." Finally, dielectric layer 170 may be referred to herein as "one or more upper dielectric layers."

In various embodiments, the source electrode 140 and the drain electrode 145 are formed over and contact source and drain regions 142, 147 in the active region 125 of semiconductor substrate 110. The source electrode 140 and the drain electrode 145 may be formed inside a source opening and a drain opening (e.g., openings 432, 434, FIG. 4), respectively, which extend through the first dielectric layer 130. More particularly, the source and drain electrodes 140, 145 contact the bottoms and sidewalls of the above-mentioned source and drain openings. For example, in one or more embodiments, the bottom extents of the source electrode 140 and the drain electrode 145 may be formed over and in contact with the cap layer 109. In other embodiments (not shown), one or both of the source electrode 140 and the drain electrode 145 may be recessed through the cap layer 109 and extend partially through the barrier layer 108, or one or both of the source electrode 140 and the drain electrode 145 may be fully recessed through the barrier layer 108 and in contact with the channel layer 104.

The source and drain electrodes 140, 145 may be formed from portions of a first conductive layer, which may include one or more conductive material sub-layers. The first conductive layer, when annealed, results in the formation of ohmic contacts between the channel 107 and the below-described source and drain regions 142, 147. Accordingly, the first conductive layer may be referred to alternatively as an "ohmic layer" or "ohmic stack."

The source and drain regions 142, 147 correspond to portions of the semiconductor substrate 110 that underlie the source and drain electrodes 140, 145, respectively. In some embodiments, the source and drain regions 142, 147 may be not intentionally doped (NID) regions of the semiconductor substrate 110. In other embodiments, ion implantation or a diffusion process may be used to create intentionally-doped source and drain regions 142, 147.

In an embodiment, the gate structure 150 is formed on or over the semiconductor substrate 110 in the active region 125. As will be described in more detail in conjunction with FIGS. 6-14, the gate structure 150 may be a multiple-part gate structure, where each part is formed from a portions of a different conductive layer, in accordance with one or more embodiments. More particularly, the gate structure 150 may include a first gate electrode 152 (i.e., a first part of the gate structure 150) and a second gate electrode 154 (i.e., a second part of the gate structure 150), which alternatively may be referred to as a lower gate electrode and an upper gate electrode, respectively. The lower gate electrode 152 is formed from a first portion of a first conductive layer (e.g., a first portion of layer 750 or 750', FIGS. 7, 10). The lower gate electrode 152 (i.e., the first portion of the first conductive layer) has a first segment (e.g., segment 1151, FIG. 11) that extends into a first gate opening (e.g., opening 650, FIG. 6) through one or more of the dielectric layers (e.g., through one or more lower dielectric layers 130, 132) to contact sidewalls of the first gate opening and the upper surface 103 of the semiconductor substrate 110. The lower gate electrode also has second and third segments (e.g., segments 1152, 1154, FIG. 11) that overlie the one or more dielectric layers (e.g., that overlie or contact layer 132) on both sides of the first gate opening. In other embodiments, rather than contacting the upper surface 103 of the substrate 110, the lower gate electrode 152 may be formed to contact the barrier layer 108 by carefully removing the cap layer 109 and part of the barrier layer 108.

Figure 7:
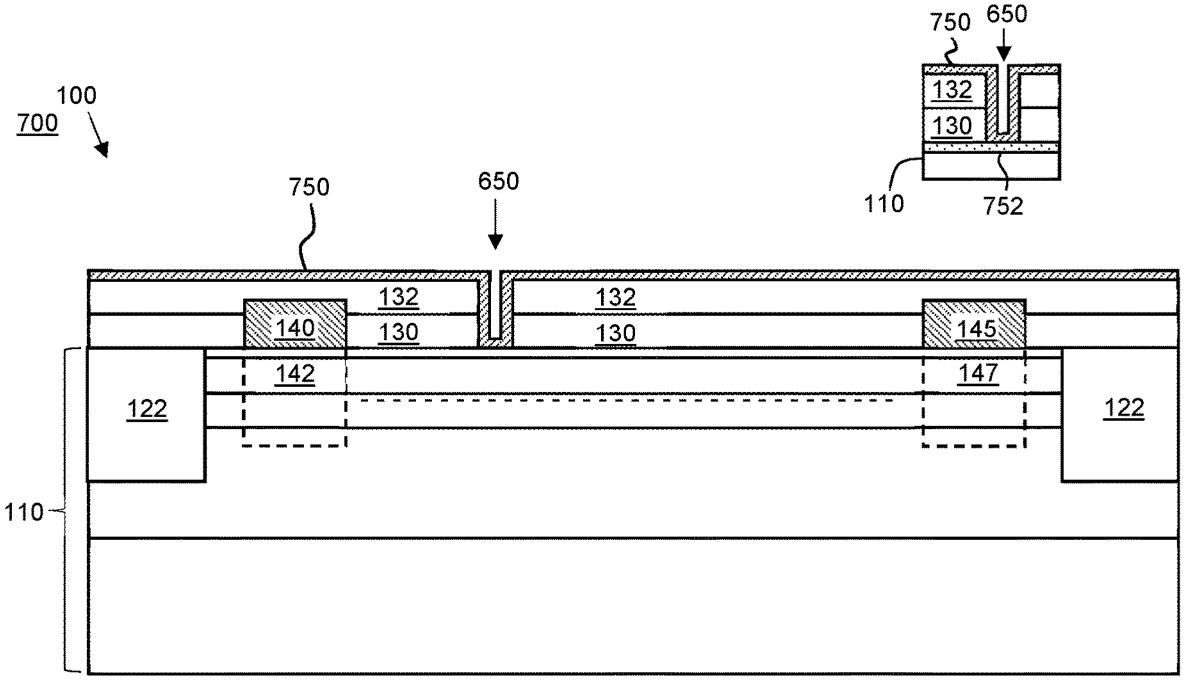
Figure 10:
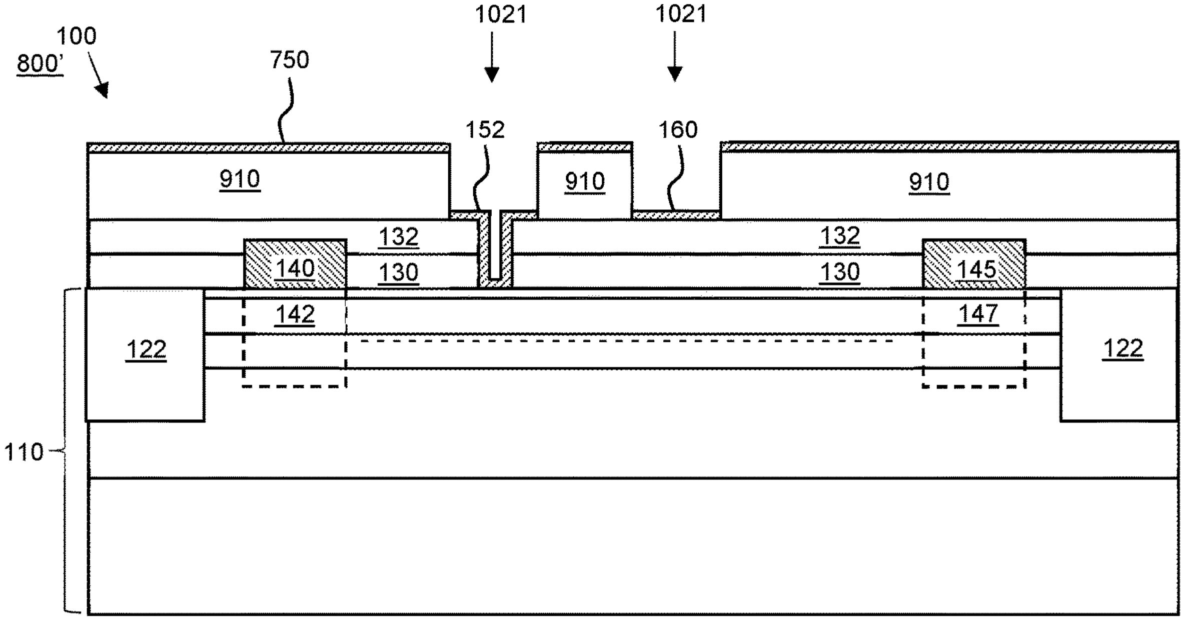

According to various embodiments, the lower gate electrode 152 may be formed from a metal stack of one or more Schottky materials (e.g., layer 750 or 750', FIGS. 7, 10). Accordingly, the lower gate electrode 152 may be a low-loss, Schottky gate electrode, according to various embodiments. In one or more embodiments, the metal stack used to form the lower gate electrode 152 may be relatively thin (e.g., less than 100 nanometers). As will be described in detail later, the lower gate electrode 152 is formed simultaneously with forming the below-described field plate 160 (e.g., using a single mask), and thus the two features 152, 160 are "self-aligned," which enables a reduction in the space (distance) between the lower gate electrode 152 and the field plate 160, when compared with spacings that can be achieved using conventional gate structures and methods of their formation.

Figure 13:
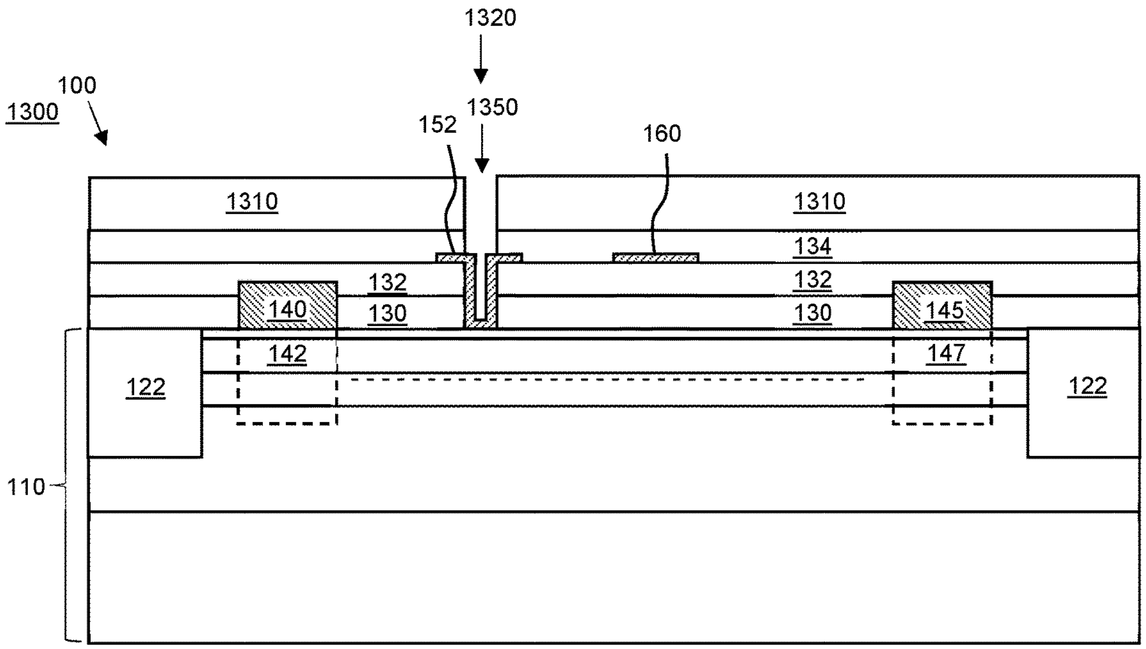
Figure 14:
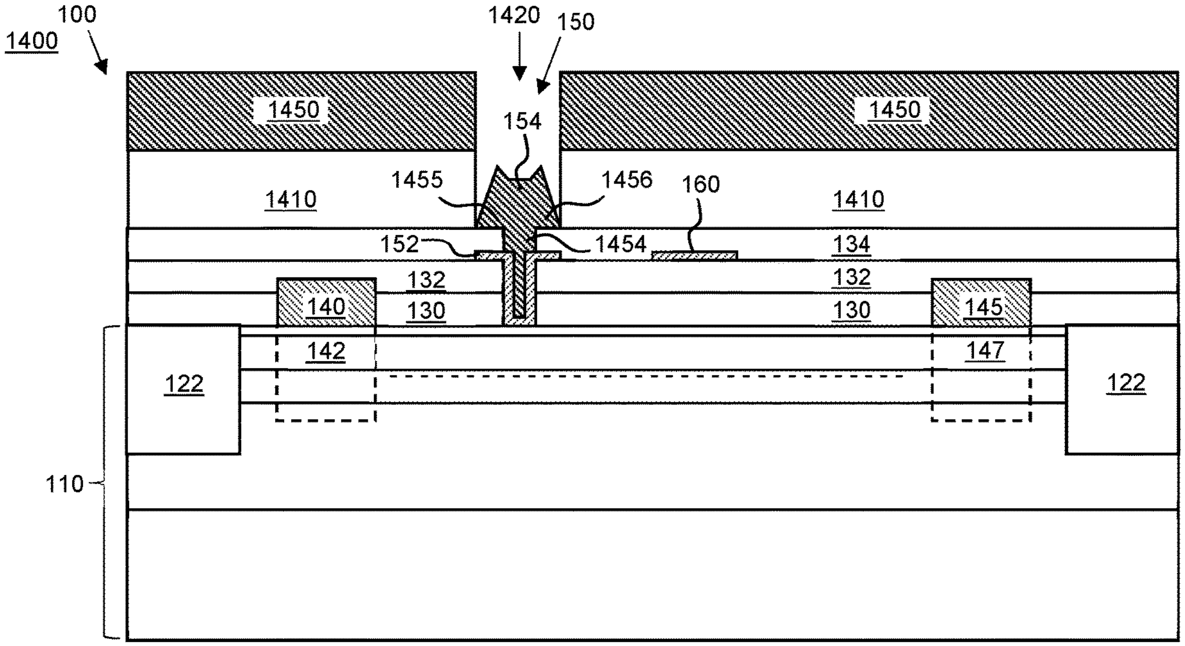

According to one or more embodiments, the upper gate electrode 154 is formed on and over the lower gate electrode 152 from a portion of a second conductive layer (e.g., layer 1450, FIG. 14). In some embodiments, the upper gate electrode 154 may have a vertical stem (e.g., stem 1454, FIG. 14) and protruding regions (e.g., regions 1455, 1456, FIG. 14), and accordingly the cross-sectional shape of the upper gate electrode 154 is essentially T-shaped (or mushroom shaped). The vertical stem extends from the lower gate electrode 152 to the upper surface of the third dielectric layer 134 (or the one or more intermediate dielectric layers), and the protruding regions are coupled to the vertical stem and extend over portions of the third dielectric layer 134 toward the source and drain electrodes 140, 145, respectively, according to various embodiments. In one or more embodiments, the upper gate electrode 154 is formed so that the vertical stem is deposited within a second gate opening (e.g., opening 1134, FIG. 13) through the third dielectric layer 134, and the protruding regions directly contact the upper surface of the third dielectric layer 134 (i.e., no other material layers are intervening).

The upper gate electrode 154 may function to lower the gate and field plate resistance, as well as suppressing stray gate-to-drain capacitance that may otherwise reduce the low gate-to-drain capacitance benefit of the field plate design. Essentially, embodiments of the below-described fabrication process may enable a transistor with reduced gate resistance and a corresponding increase in power gain without significantly increasing gate-to-drain capacitance.

Without departing from the scope of the inventive subject matter, numerous other embodiments of gate structures may be realized. The exemplary embodiment of FIG. 1 depicts the gate structure 150 as having a upper gate electrode 154 with a symmetrical T-shaped cross-section (i.e., with a vertical stem and symmetrical first and second protruding regions). In other embodiments, such as that illustrated in FIGS. 24 and 25, an alternate embodiment of the upper gate electrode 154' may have an asymmetrical T-shaped cross-section. In still other embodiments, such as that illustrated in FIGS. 27 and 28, another alternate embodiment of the upper gate electrode 154" may have a trapezoid shaped cross-section with no protruding regions.

The gate structure 150 is electrically coupled to the channel 107 through the cap layer 109 (if included) and the barrier layer 108. In still other embodiments (not shown), the gate structure 150 may be recessed through the cap layer 109 and extend partially into the barrier layer 108, increasing the electrical coupling of the gate structure 150 to the channel 107 through the barrier layer 108. In still other embodiments (not shown), the cap layer 109 may be omitted and the gate structure 150 may contact the barrier layer 108 directly. In still other embodiments (as shown in FIG. 7), the gate structure 150 may be disposed over a gate dielectric (e.g., dielectric 752, FIG. 7) that is formed between the gate structure 150 and the semiconductor substrate 110 to form a metal-insulator-semiconductor field effect transistor (MISFET) device. Either way, changes to the electric potential applied to the gate structure 150 may shift the quasi Fermi level for the barrier layer 108 with respect to the quasi Fermi level for the channel layer 106, thereby modulating the electron concentration in the channel 107 within the semiconductor substrate 110 under the gate structure 150.

In one or more embodiments, the field plate 160 is formed from a second portion of the same conductive layer (e.g., layer 750 or 750', FIGS. 7, 10) that is used to form the lower gate electrode 152. Accordingly, as mentioned above, the lower gate electrode 152 and the field plate 160 may be fabricated in a simultaneous and self-aligned manner, as will be described in conjunction with FIGS. 7-10.

The field plate 160 is located adjacent to the gate structure 150, and between the gate structure 150 and the drain electrode 145. In addition, the field plate 160 is electrically coupled to the source electrode 140 through a field plate-to-source connection 180. During operation of device 100, the field plate 160 may function to reduce the electric field at the gate-drain edge, and reduce the associated gate-to-drain capacitance between the gate structure 150 and the drain electrode 145.

The relative arrangement of the gate structure 150 and the field plate 160 may be characterized by a gate-to-field plate spacing (e.g., spacing 1155, FIG. 11), according to an embodiment. It may be noted here that the below-described, self-aligned processes for forming the lower gate electrode 152 and the lower field plate 160 enables designs with a very short gate-to-field plate spacing 1155, when compared with structures that are achievable using conventional methods. In some embodiments, the field plate-to-gate distance may be between about 0.2 microns and about 0.5 microns, although the field plate-to-gate distance may be shorter or longer, as well.

A first metal-insulator-semiconductor region 167 may be created by the field plate 160, the underlying dielectric layers 130, 132, and the semiconductor substrate 110. In an embodiment, the first metal-insulator-semiconductor region 167 may act as part of the active device. The first metal-insulator-semiconductor region 167 has a first threshold voltage, which is dependent on characteristics of the first and second dielectric layers 130, 132, the barrier layer 108 and the cap layer 109, and the amount of charge in channel 107. In an embodiment, the first threshold voltage may be between about −5 volts and about −15 volts. In other embodiments, the first threshold voltage may be between about −4 volts and about −50 volts.

A fourth dielectric layer 170 (or one or more upper dielectric layers) is disposed on or over the third dielectric layer 134, the source and drain electrodes 140 and 145, the gate structure 150, and the field plate 160. Source metallization 185, drain metallization 186, and a field plate-to-source connection 180 are formed on or over the fourth dielectric layer 170 from another conductive layer (e.g., layer 1750, FIG. 17). This conductive layer extends into source, drain, and field plate openings (e.g., openings 1620, FIG. 16) to contact the source electrode 140, drain electrode 145, and field plate 160, respectively.

In some embodiments, the field plate-to-source connection 180 includes conductive straps 188, which are relatively-thin conductors spaced along the transistor finger, which extend, periodically, over the gate structure 150 to electrically connect the field plate 160 to the source electrode 140. In other embodiments, connections between the field plate 160 and the source electrode 140 may be accomplished using another metal layer (e.g., an interconnect layer). In still other embodiments, rather than including conductive straps 188, the field plate-to-source connection 180 may include a solid, continuous conductive structure between the field plate 160 and the source electrode 140.

In an embodiment, GaN HFET device 100 may be configured as a transistor finger, in which the source electrode 140, the drain electrode 145, the gate structure 150, and the field plate 160 may be configured as elongated, parallel elements. For example, in such a transistor finger, a "length" of the gate structure 150 (i.e., dimension 1157, FIG. 11) is significantly smaller than a "width" of the gate electrode (i.e., a dimension perpendicular to the gate length). In some embodiments, the gate length may be between about 0.2 microns and about 2 microns, although the gate length may be shorter or longer, as well. In some embodiments, the gate width may be between about 4 microns and about 1000 microns, or longer.

Figure 2:
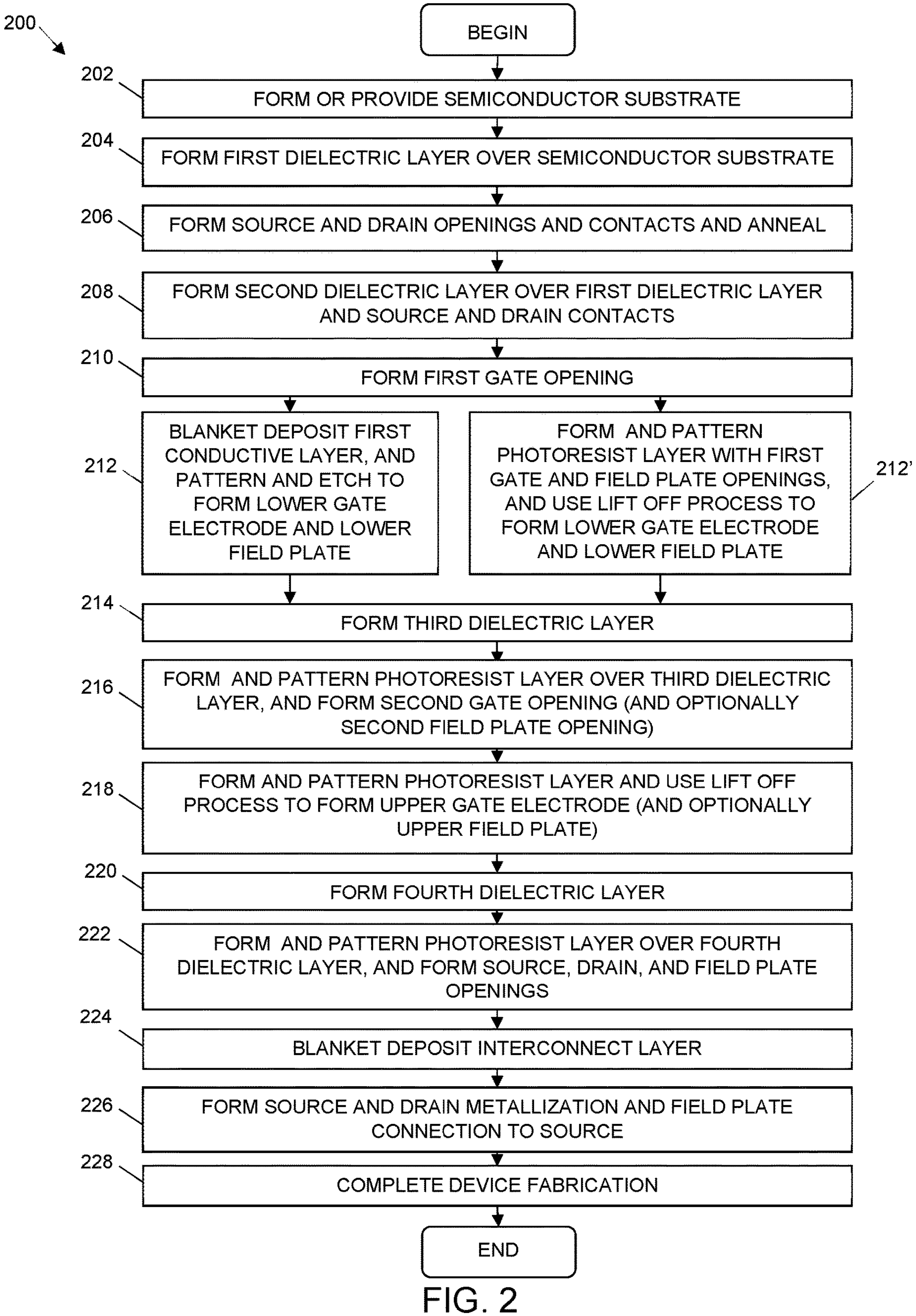
FIG. 2 is a process flow diagram for a method for fabricating the transistor of FIG. 1, in accordance with an embodiment.

Referring now to FIG. 2, flowchart 200 of FIG. 2 depicts an embodiment of a method for fabricating a semiconductor device (e.g., GaN HFET device 100, FIG. 1). FIG. 2 should be viewed alongside FIGS. 3-20, which illustrate cross-sectional, side views of a series of fabrication stages for producing the semiconductor device 100 of FIG. 1, in accordance with one or more example embodiments.

Figure 3:
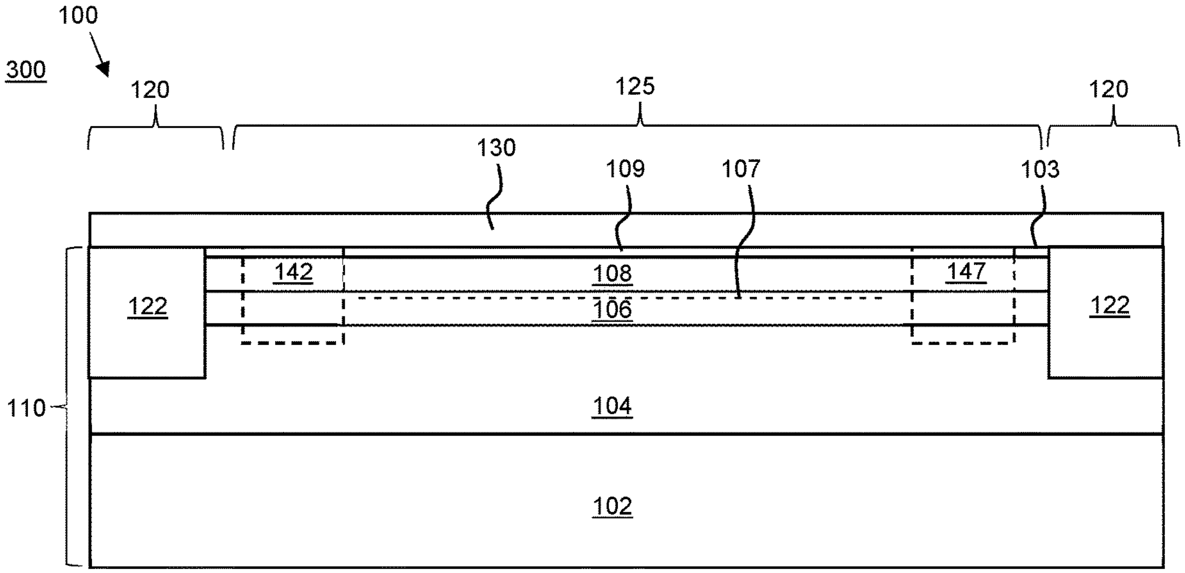
FIGS. 3, 4, 5, 6, 7, and 8 are cross-sectional, side views of partially formed versions of the transistor of FIG. 1 illustrating various stages of fabrication, in accordance with one or more embodiments.

The method may begin in block 202 of FIG. 2, and as depicted in fabrication stage 300 of FIG. 3, by forming or providing a semiconductor substrate 110. In an embodiment, stage 300 may include providing a host substrate 102, and forming a number of semiconductor layers 104, 106, 108, and 109 (described in detail below) on or over the host substrate 102. The semiconductor layers 104, 106, 108, and 109 may be grown using one of metal-organic chemical vapor deposition (MOCVD), molecular beam epitaxy (MBE), hydride-vapor phase epitaxy (HVPE) or a combination of these techniques, although other suitable techniques may alternatively be used.

As mentioned above, according to one or more embodiments, the host substrate 102 may include silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials.

A nucleation layer (not shown) may be formed on an upper surface of the host substrate 102 between the buffer layer 104 and the host substrate 102. In an embodiment, the nucleation layer may include AlN.

The buffer layer 104 may include a number of group III-N semiconductor layers formed on or over the host substrate 102. Each of the semiconductor layers of the buffer layer 104 may include an epitaxially grown group III-nitride epitaxial layer. The group-III nitride epitaxial layers that make up the buffer layer 104 may be nitrogen (N)-face or gallium (Ga)-face material, for example. For example, the buffer layer 104 may include at least one AlGaN mixed crystal layer having a composition denoted by $Al_XGa_{1-X}N$ with an aluminum mole fraction, X, which can take on values between 0 and 1. The total thickness of the buffer layer 104 with all of its layers may be between about 200 angstroms and about 100,000 angstroms although other thicknesses may be used. A limiting X value of 0 yields pure GaN while a value of 1 yields pure aluminum nitride (AlN). Some embodiments may include a buffer layer 104 disposed on or over the host substrate and nucleation layer (not shown).

The buffer layer 104 may include additional $Al_XGa_{1-X}N$ layers. The thickness of the additional $Al_XGa_{1-X}N$ layer(s) may be between about 200 angstroms and about 50,000 angstroms though other thicknesses may be used. In an embodiment, the additional $Al_XGa_{1-X}N$ layers may be configured as GaN (X=0) where the $Al_XGa_{1-X}N$ is not intentionally doped (NID). The additional $Al_XGa_{1-X}N$ layers may also be configured as one or more GaN layers where the one or more GaN layers are intentionally doped with dopants that may include iron (Fe), chromium (Cr), magnesium (Mg), carbon (C) or other suitable dopants that render the buffer layer 104 substantially insulating or high resistivity. The dopant concentration may be between about $10^{16}$ $cm^{-3}$ and $10^{19}$ $cm^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments (not shown), the additional layers may be configured as a superlattice where the additional layers include a series of alternating NID or doped $Al_XGa_{1-X}N$ layers where the value of X takes a value between 0 and 1. In still other embodiments, the buffer layer 104 may also include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2000 angstroms, though other thicknesses may be used.

In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, a channel layer 106 may be formed on or over the buffer layer 104. The channel layer 106 may include one or more group III-N semiconductor layers. The channel layer 106 may include an $Al_XGa_{1-X}N$ layer where X takes on values between 0 and 1. In an embodiment, the channel layer 106 is configured as GaN (X=0) although other values of X may be used without departing from the scope of the inventive subject matter. The thickness of the channel layer 106 may be between about 50 angstroms and about 10,000 angstroms though other thicknesses may be used. The channel layer 106 may be NID or, alternatively, may include Si, germanium (Ge), C, Fe, Cr, or other suitable dopants. The dopant concentration may be between about $10^{15}$ $cm^{-3}$ and about $10^{19}$ $cm^{-3}$ though other higher or lower concentrations may be used. In other embodiments, the channel layer 106 may include NID or doped $In_YGa_{1-Y}N$, where Y, the indium mole fraction, may take a value between 0 and 1.

In an embodiment, a barrier layer 108 may be formed on or over the channel layer 106. The barrier layer 108 may include one or more group III-N semiconductor layers. In some embodiments, the barrier layer 108 has a larger bandgap and larger spontaneous polarization than the channel layer 106 and, when the barrier layer 108 is in direct contact with the channel layer 106, a channel 107 is created in the form of a two-dimensional electron gas (2-DEG) within the channel layer 106 near the interface between the channel layer 106 and barrier layer 108. In addition, strain between the barrier layer 108 and channel layer 106 may cause additional piezoelectric charge to be generated and lead to the formation of the 2-DEG and channel 107. The barrier layer 108 may include at least one NID $Al_XGa_{1-X}N$ layer where X takes on values between 0 and 1. In some embodiments, X may take a value of 0.1 to 0.35, although other values of X may be used. The thickness of the barrier layer 108 may be between about 50 angstroms and about 1000 angstroms though other thicknesses may be used. The barrier layer 108 may be NID or, alternatively, may include Si, Ge, C, Fe, Cr, or other suitable dopants. The dopant concentration may be between about $10^{16}$ $cm^{-3}$ and $10^{19}$ $cm^{-3}$ though other higher or lower concentrations may be used.

In an embodiment, an additional AlN interbarrier layer (not shown) may be formed between the channel layer 106 and the barrier layer 108, according to an embodiment. The AlN interbarrier layer may increase the channel charge and improve the electron confinement of the resultant 2-DEG, while also increasing the charge mobility.

In other embodiments, the barrier layer 108 may include indium aluminum nitride (InAlN) layers, denoted $In_YAl_{1-Y}N$, where Y, the indium mole fraction, may take a value between about 0.1 and about 0.2 though other values of Y may be used. In the case of an InAlN barrier, the thickness of the barrier layer 108 may be between about 30 angstroms and about 1000 angstroms though other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ $cm^{-3}$ and about $10^{19}$ $cm^{-3}$ though other higher or lower concentrations may be used.

In one or more embodiments, a cap layer 109 may be formed on or over the barrier layer 108. The cap layer 109 may present a stable surface for the semiconductor substrate 110 and may protect the surface of the semiconductor substrate 110 from chemical and environmental exposure incident to wafer processing. The cap layer 109 may include one or more group III-N semiconductor layers. In an embodiment, the cap layer 109 is GaN. The thickness of the cap layer 109 may be between about 5 angstroms and about 100 angstroms though other thicknesses may be used. The cap layer 109 may be NID or, alternatively, may include Si, Ge, C, Fe, Cr, or other suitable dopants. The dopant concentration may be between about $10^{16}$ $cm^{-3}$ and $10^{19}$ $cm^{-3}$ though other higher or lower concentrations may be used.

In some embodiments, intentionally-doped source and drain regions 142, 147 may be formed through the upper surface 103 of the semiconductor substrate 110 during stage 300 or later. For example, an implant mask (not shown) may be formed on the upper surface 103 of the semiconductor substrate 110, and openings may be formed in the mask to expose areas of the upper surface 103 where the source and drain regions 142, 147 are to be formed. An ion implantation process may then be performed to implant dopant species into the exposed areas, thus producing doped source and drain regions 142, 147. In various embodiments, Si, Ge, O, or another suitable n-type dopant may be implanted into the semiconductor substrate 110 through the implant mask. According to an embodiment, the dopant species may be activated by annealing the semiconductor substrate 110 using an activation annealing process. Alternatively, in other embodiments, the source and drain regions 142, 147 may be NID regions of the semiconductor substrate 110.

In some embodiments, high resistivity regions 122 may be formed through the upper surface 103 of the semiconductor substrate 110 during stage 300 or later. For example, the high resistivity regions 122 may be formed by dispensing and patterning a photoresist layer on or over upper surface 103 of the semiconductor substrate 110, and then defining openings in the photoresist layer in the desired locations of the high resistivity regions 122. As used herein, the term "photoresist mask" refers to a patterned photoresist layer. Using ion implantation, a dopant species (e.g., one or more of oxygen, nitrogen, boron, arsenic, helium, and/or argon) may be driven into the semiconductor substrate 110 to create the high resistivity regions 122. In an embodiment, the energy and dose of the implant may be configured to create a sufficient amount of damage in the crystal structure of the semiconductor substrate 110 such that the semiconductor substrate is substantially high resistivity or semi-insulating within the high resistivity regions 122. In other embodiments (not shown), forming the high resistivity regions 122 may include, first, etching some or all of the semiconductor layers in the semiconductor substrate 110 and then ion implanting to enhance the resistivity in the remaining semiconductor layers and/or the host substrate 102. The photoresist mask is removed before proceeding to the next fabrication stage.

In block 204 of FIG. 2, and as also depicted in fabrication stage 300 of FIG. 3, the method may continue by forming a first dielectric layer 130 (e.g., a surface passivation layer) on or over the upper surface 103 of the semiconductor substrate 110. The first dielectric layer 130 may be formed using one or more processes selected from low pressure chemical vapor deposition (LPCVD), atomic layer deposition (ALD), sputtering, physical vapor deposition (PVD), MBE, chemical vapor deposition (CVD) (including plasma-enhanced (PE) CVD, MOCVD, catalytic CVD, hot wire (HW) CVD, inductively coupled plasma (ICP) CVD, and electron-cyclotron resonance (ECR) CVD), a combination of these or other suitable dielectric deposition technique(s).

The first dielectric layer 130 may be formed from one or more suitable dielectric materials including silicon dioxide ($SiO_2$), silicon nitride (SiN), silicon oxynitride (SiON), aluminum oxide ($Al_2O_3$), aluminum nitride (AlN), and hafnium oxide ($HfO_2$), though other substantially insulating materials may be used. The first dielectric layer 130 may have a thickness of between 200 angstroms and 1000 angstroms. In other embodiments, the first dielectric layer 130 may have a thickness of between 50 angstroms and 10,000 angstroms, though other thicknesses may be used.

Figure 4:
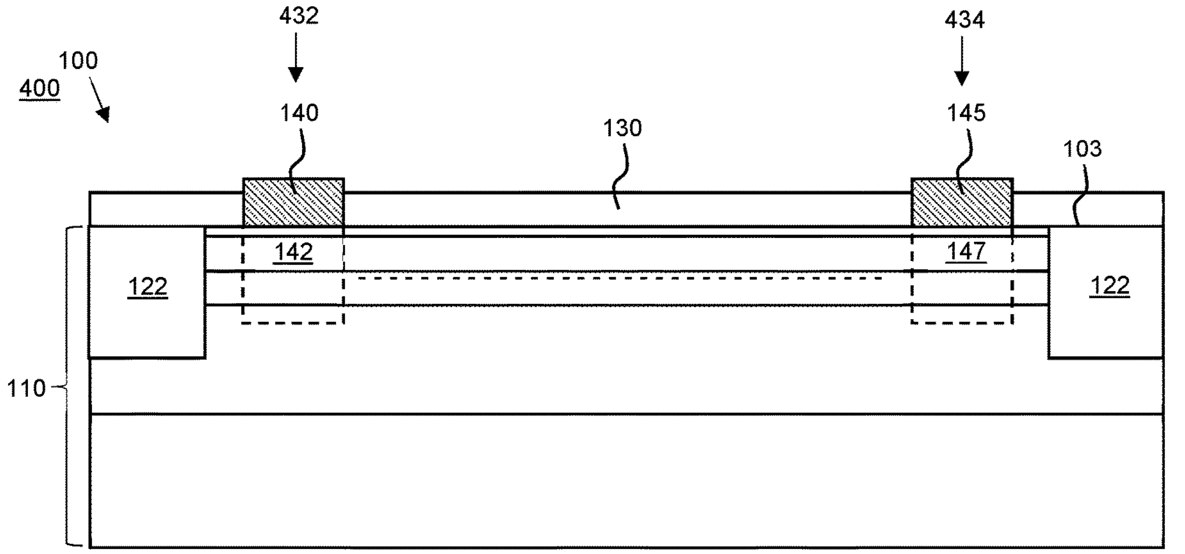

In block 206 of FIG. 2, and as depicted in fabrication stage 400 of FIG. 4, the method may continue by forming source and drain contacts 140, 145. For example, the source and drain contacts 140, 145 may be formed by creating source and drain openings 423, 434 through the first dielectric layer 130, followed by depositing and patterning a conductive layer (e.g., an "ohmic layer" or "ohmic stack"), which extends into the source and drain openings 432, 434.

To create the source and drain openings 432, 434, a photoresist layer is deposited over the semiconductor substrate 110, and the photoresist layer is patterned to form photoresist openings over the source and drain regions 142, 147. The source and drain openings 432, 434 then may be created by etching through the first dielectric layer 130 in areas exposed by the photoresist openings, while stopping at or slightly below the upper surface 103 of the base substrate 110. Etching the first dielectric layer 130 preferably includes performing one or more dry etching processes, such as reactive ion etching (RIE), ICP etching, ECR etching, or another suitable dry etching process. According to one or more embodiments, suitable dry etching techniques may use one or more of sulphur hexafluoride ($SF_6$), di-carbon hexafluoride ($C_2F_6$), carbon tetrafluoride ($CF_4$), tri-fluoromethane ($CHF_3$) or other chemistries. In alternate embodiments, a suitable wet chemical etching process alternatively may be performed. The photoresist mask may be removed after forming the source and drain openings 432, 434.

Formation of the source and drain contacts 140, 145 continues by depositing the constituent layers of an ohmic stack may over the surface of the first dielectric layer 130 and into the source and drain openings 432, 434. In various embodiments, the constituent layer(s) of the ohmic stack may be deposited by sputtering, evaporation, PVD, or other suitable deposition techniques. In one or more embodiments, the ohmic stack may contain one or more conductive layers that include titanium (Ti), Al, titanium nitride (TiN), gold (Au), molybdenum (Mo), nickel (Ni), Si, Ge, platinum (Pt), tantalum (Ta), and/or other suitable materials. In other embodiments, the conductive layer(s) of the ohmic stack may include titanium-tungsten (TiW), titanium-aluminum (TiAl), or titanium-tungsten nitride (TiWN). In one or more specific embodiments, the ohmic stack may include a stack deposited into the source and drain openings 432, 434 that includes a Ti layer on the surface 103 of the substrate 110, an Al on or over the Ti layer, and a TiN layer on or over the Ti layer. For example, the Ti layer may be between about 10 angstroms and about 200 angstroms thick, the Al layer may be between about 100 angstroms and about 1500 angstroms thick, and the TiN layer may be between about 200 angstroms and about 2000 angstroms thick, although other thicknesses alternatively may be used. In other embodiments, other metals may be substituted for or placed additionally below or on top of the constituent layers of the ohmic stack (e.g., Mo, or Pt may be substituted for TiN, or Ta may be used in addition to Ti, above or below Ti, or substituted for Ti).

After depositing the constituent layers of the ohmic stack, an annealing process may be performed to alloy the ohmic stack, resulting in ohmic contacts to the source and drain regions 142 and 147 of the semiconductor substrate 110 (i.e., to the 2-DEG of the channel 107). In an embodiment, the annealing step may be accomplished by rapid thermal annealing. For example, the ohmic stack may be alloyed at a temperature of between about 400 degrees Celsius and about 700 degrees Celsius for between about 15 seconds and about 60 seconds. In other embodiments the ohmic stack may be annealed at between about 300 degrees Celsius and about 900 degrees Celsius for between about 10 seconds and about 600 seconds, though other higher or lower temperatures and/or times may be used.

To complete the formation of the source and drain contacts 140, 145, the annealed ohmic stack is then patterned to form the source and drain electrodes 140 and 145. More specifically, a second photoresist layer may be deposited over the ohmic stack, and the photoresist layer is patterned to form photoresist openings over portions of the ohmic stack outside of the desired locations of the source and drain electrodes 140, 145. Said another way, the second photoresist layer is patterned to protect portions of the ohmic stack within the source and drain openings 432, 434. Portions of the ohmic stack that are exposed through the openings in the second photoresist layer are then removed by etching through the ohmic stack, while stopping at the upper surface of the first dielectric layer 130. Etching the ohmic stack preferably includes performing a well-controlled dry etching process, such as RIE, ICP etching, ECR etching, or other suitable dry etching processes. In an alternate embodiment, a suitable wet chemical etching process may be performed. The etching process results in the formation of the source and drain electrodes 140, 145.

Figure 5:
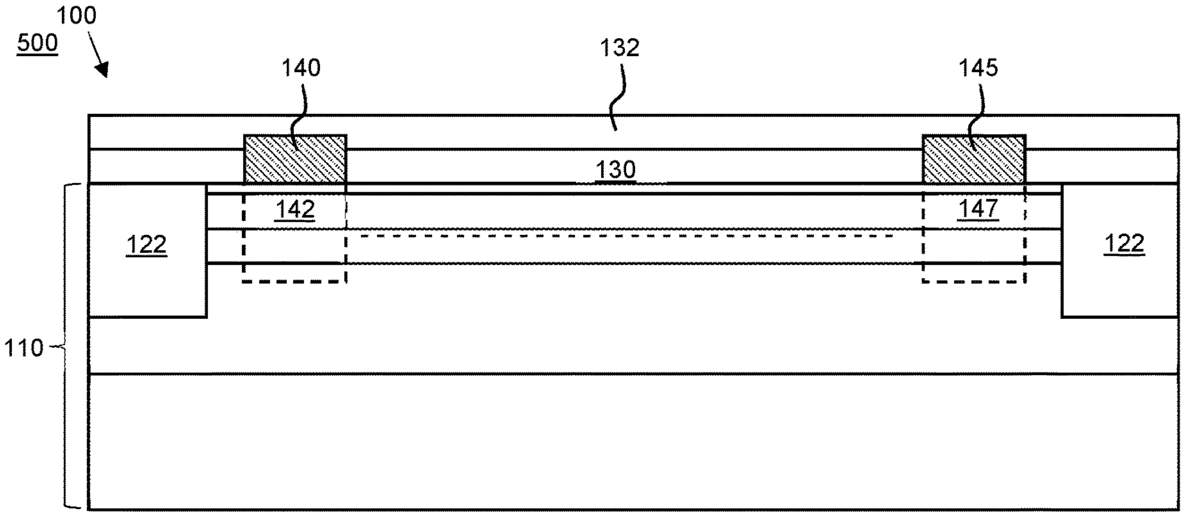

In block 208 of FIG. 2, and as also depicted in fabrication stage 500 of FIG. 5, the method may continue by forming a second dielectric layer 132 (e.g., a “capping” dielectric layer) on or over the first dielectric layer 130 and the source and drain electrodes 140, 145. The first and second dielectric layers 130, 132 may collectively be referred to as “one or more lower dielectric layers”, herein. The second dielectric layer 132 may function to protect the source and drain electrodes 140, 145 during subsequent processing steps, and particularly if atomic layer deposition (ALD) is used, for example, in block 212 or 212' (stage 700 or 800' of FIG. 7 or 10). Generally, it is undesirable to expose the source and drain electrodes 140, 145 in an ALD chamber, although in some embodiments, this may be acceptable. The second dielectric layer 132 may be formed using one or more processes selected from LPCVD, sputtering, PVD, MBE, CVD, a combination of these or other suitable dielectric deposition technique(s).

The second dielectric layer 132 may be formed from one or more suitable dielectric materials including $SiO_2$, SiN, SiON, $Al_2O_3$, AlN, and $HfO_2$, though other substantially insulating materials may be used. Desirably, the material selected for the second dielectric layer 132 is a relatively low-k dielectric material (i.e., a dielectric material with a low relative dielectric constant, such as a dielectric constant less than about 3.9). This may help to reduce fringing capacitances. The second dielectric layer 132 may have a thickness of between 200 angstroms and 1000 angstroms. In other embodiments, the second dielectric layer 132 may have a thickness of between 50 angstroms and 10,000 angstroms, though other thicknesses may be used.

Figure 6:
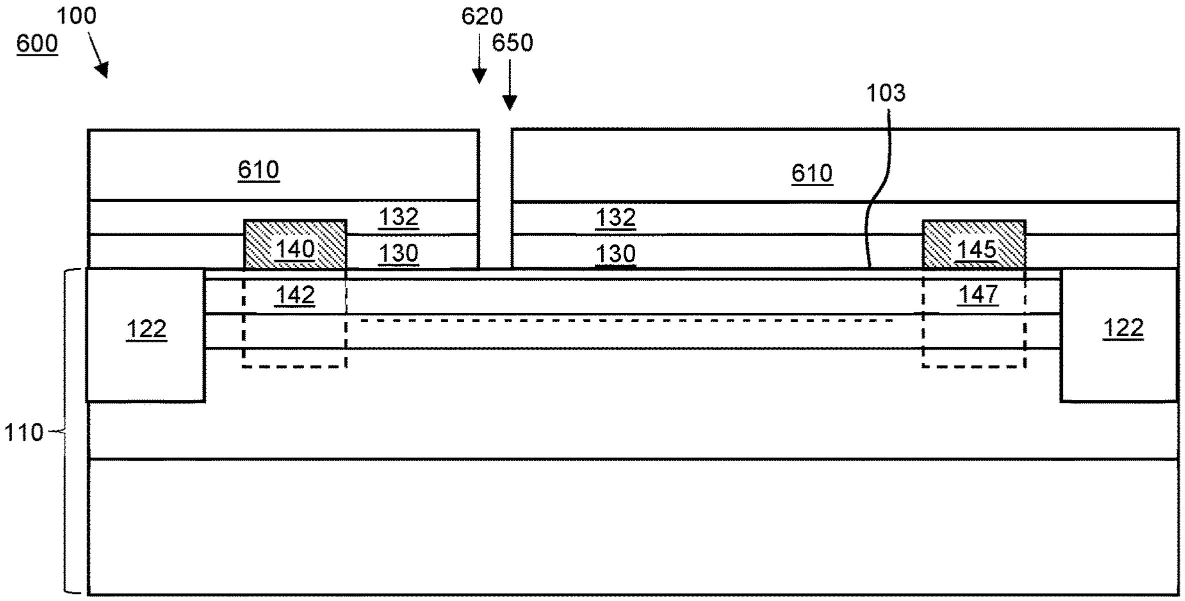

In block 210 of FIG. 2, and as depicted in fabrication stage 600 of FIG. 6, the method may continue by forming a first gate opening 650 through the first and second dielectric layers 130, 132. This includes forming and patterning a photoresist layer 610 over the semiconductor substrate 110 (and more particularly on or over the first and second dielectric layers 130, 132). Once dispensed, the photoresist layer 610 is patterned to form photoresist opening 620 over the portion of the dielectric layers 130, 132 through which the gate opening 650 is to be formed.

In an embodiment, the gate opening 650 then may be created by etching through the second and first dielectric layers 132, 130 in the area exposed by the photoresist openings 620, while stopping at the upper surface 103 of the base substrate 110. Etching the second and first dielectric layers 132, 130 may include performing one or more dry etching processes and chemistries, such as those discussed in conjunction with forming the source and drain openings in block 206 and FIG. 4. For example, RIE, ICP etching, ECR etching, or another suitable dry etching process may be used with a fluorine-based etch chemistry. In alternate embodiments, a suitable wet chemical etching process alternatively may be performed. The etching process may result in the first gate opening 650 having substantially vertical sidewalls. However, if later processes (e.g., process 700, described below) include depositing conductive material on the sidewalls of the first gate opening 650 using evaporation, it may be desirable for the sidewalls of the first gate opening 650 to be tapered. Either way, once the first gate opening 650 is formed, the photoresist layer 610 may then be removed.

According to one or more embodiments, the lower electrode 152 of the gate structure 150 and the lower field plate 160 may then be formed. According to a first embodiment, as reflected in block 212 of FIG. 2, the lower electrode 152 and lower field plate 160 may be formed by depositing and patterning a first conductive layer 750 (also referred to as a "lower gate and field plate layer"). More specifically, as depicted in fabrication stage 700 of FIG. 7, the first conductive layer 750 is conformally deposited on or over the second dielectric layer 132 and into the first gate opening 650. The portion of the first conductive layer 750 within the first gate opening 650 is conformal, in that it contacts the sidewalls and the bottom extent of the first gate opening 650 (i.e., the portion of the semiconductor substrate 110 that is exposed within the gate opening 650), while potentially leaving the rest of the first gate opening 650 unfilled. In other words, there may be a void (e.g., void 1155, FIG. 11) in the to-be-formed, lower gate electrode 152. In other embodiments, the thickness of layer 750 may be such that layer 750 completely fills the first gate opening 650, and no void is present. In one or more embodiments, the various layers of the first conductive layer 750 may be deposited by evaporation, sputtering, PVD, ALD, or other suitable deposition technique(s). As mentioned above, if process 700 includes depositing the first conductive layer 750 using evaporation, it may be desirable to form the first gate opening 650 (i.e., in stage 600) using a method that results in the sidewalls of the first gate opening 650 being tapered.

According to various embodiments, the first conductive layer 750 may include a metal stack of one or more Schottky material layers. For example, the layers within the multi-stack used to form the first conductive layer 750 may include Ni, Pt, Ti, Cu, palladium (Pd), Cr, W, iridium (Ir), poly-silicon or other suitable materials. According to a specific non-limiting embodiment, the first conductive layer 750 includes a stack with a layer of Ni and a layer of Pt. More specifically, the first conductive layer 750 may include a layer of Ni deposited on the surfaces of the first gate opening 650, and a layer of Pt deposited on the Ni layer. According to an embodiment, the first conductive layer 750 may be between about 30 and about 500 angstroms in thickness, although other thickness values may be used.

As shown in the small depiction of an alternate embodiment in the upper right corner of FIG. 7, in some cases, device 100 may be modified to be a MISFET device, in which the first conductive layer 750 may be disposed over a gate dielectric 752, which is present within the gate opening 650 over the upper surface of the semiconductor substrate 110. In various embodiments, the gate dielectric 752 may be formed from a dielectric material such as SiO2, HfO2, Al2O3, or similar materials. Further, for a MISFET device, it is not essential that the first conductive layer 750 include Schottky material layers, although it may be. Instead, the first conductive layer 750 may be formed from one or more suitable conductive materials.

Figure 8:
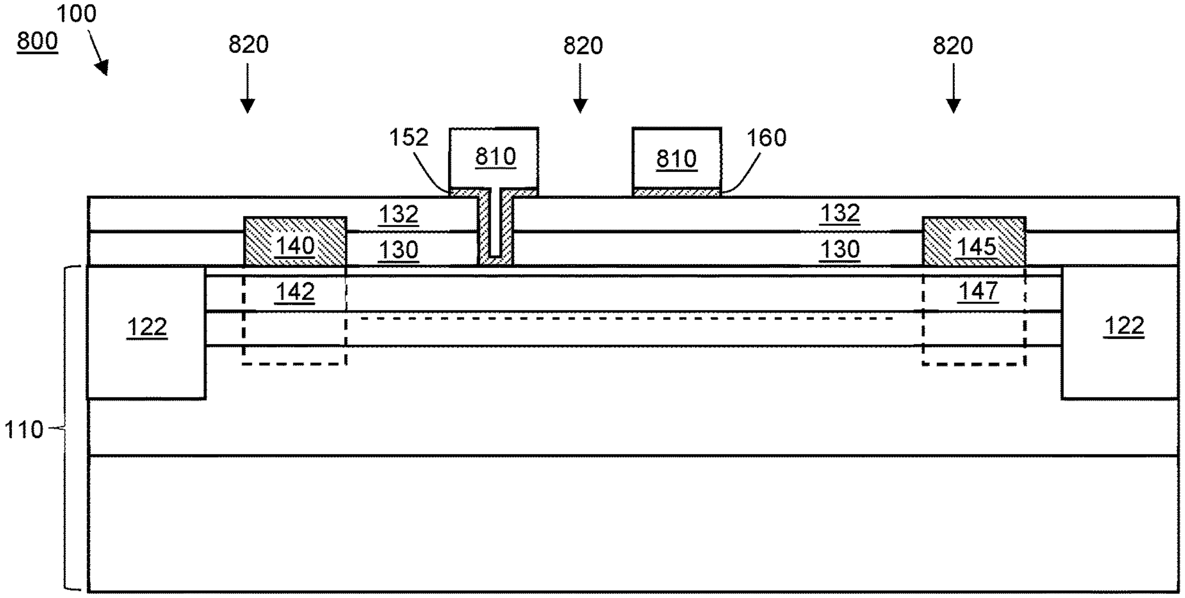
Figure 9:
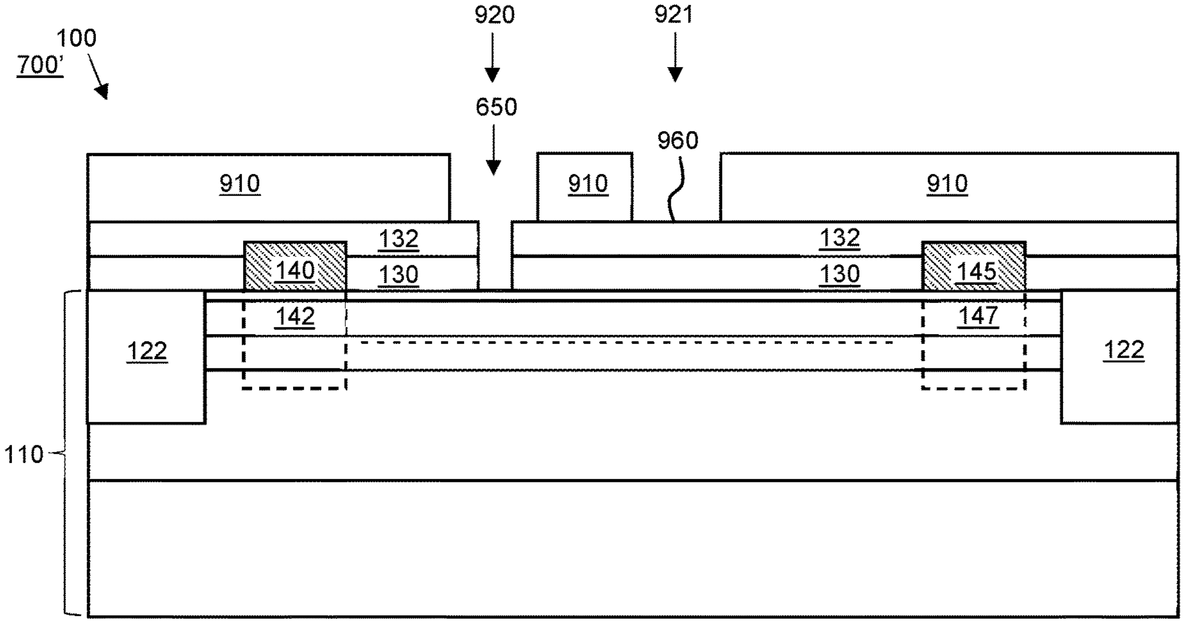
FIGS. 9 and 10 are cross-sectional, side views of partially formed versions of the transistor of FIG. 1 illustrating alternate embodiments of the fabrication stages shown in FIGS. 7 and 8.

As shown in fabrication stage 800 of FIG. 8, the first conductive layer 750 is selectively etched to form the lower gate electrode 152 and the lower field plate 160. In other words, the lower gate electrode 152 and the lower field plate 160 are formed from portions of the same conductive layer (i.e., layer 750). In addition, the lower field plate 160 and portions of the lower gate electrode 152 overlie the same dielectric layer (i.e., layer 132). According to an embodiment, forming the lower gate electrode 152 and the lower field plate 160 includes forming a photoresist layer 810 on or over the first conductive layer 750. Once dispensed, the photoresist layer 810 is patterned to form photoresist openings 820 over all portions of the device, except for those portions where the lower gate electrode 152 and the lower field plate 160 are located. In other words, the photoresist layer 810 is processed to produce a lower gate/field plate photoresist mask, which is used to protect gate and field plate portions of the first conductive layer 750 from a subsequent etching process.

In an embodiment, the lower gate electrode 152 and the lower field plate 160 then may be created by removing those portions of the first conductive layer 750 that are exposed by the photoresist openings 820, while stopping at or slightly below the upper surface of the second dielectric layer 132 (i.e., a small amount of over-etching into layer 132 is tolerable). Etching the first conductive layer 750 may include performing one or more dry etching processes (e.g., RIE, ICP etching, ECR etching), ion beam etching/milling processes, or other suitable dry or wet etching processes. For example, in the above described embodiment in which the first conductive layer 750 includes a layer of Ni and a layer of Pt, the exposed portions of the Pt layer may be removed using dry etching, and the subsequently exposed portions of the Ni layer may be removed using ion beam etching/milling. The photoresist layer 810 may then be removed, resulting in the structure shown in FIG. 11 and described later.

According to a second embodiment, as reflected in block 212' of FIG. 2, the lower electrode 152 may be formed using a lift-off process. More specifically, as depicted in the alternate fabrication stage 700' of FIG. 9, a photoresist layer 910 may be formed on or over the second dielectric layer 132, and the photoresist layer 910 may be patterned to include gate and field plate openings 920, 921. The gate opening 920 exposes the first gate opening 650 and portions of the upper surface of dielectric layer 132 on either side of the first gate opening 650. The field plate opening 921 exposes portion 960 of the upper surface of dielectric layer 132 where the to-be-formed field plate 160 will be located. In other words, the photoresist layer 910 is processed to produce a lower gate/field plate photoresist mask, which is used to protect portions of the upper surface of dielectric layer 134 outside of the areas where the gate and field plate are to be formed.

As shown in alternate fabrication stage 800' of FIG. 10, the first conductive layer 750 is then deposited on the patterned photoresist layer 910 and exposed portions of the second dielectric layer 132 and into the first gate opening 650. The portion of the first conductive layer 750 deposited within the gate opening 920 (including portions within the first gate opening 650 and on the surface of dielectric layer 132 on either side of the first gate opening 650) forms the first gate electrode 152. The portion of the first conductive layer 750 deposited within the field plate opening 921 forms the field plate 160. In one or more embodiments, the various layers of the first conductive layer 750 may be deposited using one of the same methods described for layer 750, above, in conjunction with FIG. 7 (e.g., evaporation, sputtering, PVD, or other suitable deposition technique(s)). As indicated above, if process 800' includes depositing the first conductive layer 750 using evaporation, it may be desirable to form the first gate opening 650 (i.e., in stage 600) using a method that results in the sidewalls of the first gate opening 650 being tapered. Again, the first conductive layer 750 may be formed from a metal stack of one or more Schottky material layers, as described above in conjunction with the description of layer 750, FIG. 7 (e.g., a stack including Ni, Pt, Ti, TiN, TaN, Cu, Pd, Cr, W, Ir, poly-silicon or other suitable materials). Again, although not shown, in some alternate embodiments, the first conductive layer 750 may be disposed over a gate dielectric (not shown) within the gate opening 650, such as SiO2, HfO2, Al2O3, or similar materials.

Once the first conductive layer 750 is deposited, a lift-off process is then performed to remove the photoresist layer 910 and the portions of the first conductive layer 750 deposited on the photoresist layer 910, while leaving the portion of the first conductive layer 750 deposited into the gate and field plate openings 920, 921 intact.

Figure 11:
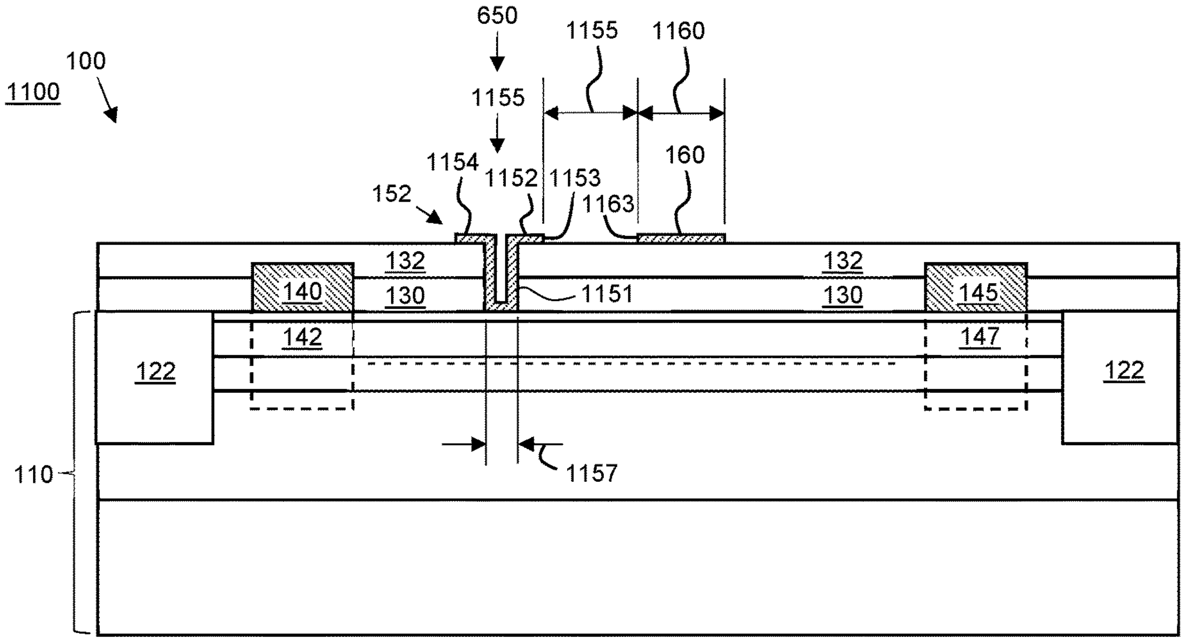
FIGS. 11, 12, 13, 14, 15, 16, 17, 18, and 19 are cross-sectional, side views of partially formed versions of the transistor of FIG. 1 illustrating various additional stages of fabrication, in accordance with one or more embodiments.

Using either the fabrication stages 700, 800 or the alternate fabrication stages 700', 800', the structure shown in fabrication stage 1100, FIG. 11, results. More specifically, at this stage of fabrication, the device 100 includes the lower gate electrode 152 (i.e., a low-loss, Schottky gate electrode) and the field plate 160. The lower gate electrode 152 is formed from a first portion of layer 750, and the field plate 160 is formed from a second portion of layer 750.

The lower gate electrode 152 has a first segment 1151 that extends into the first gate opening 650 through dielectric layers 130, 132 to contact sidewalls of the first gate opening 650 and the upper surface 103 of the semiconductor substrate 110. The lower gate electrode 152 also has second and third segments 1152, 1154 that overlie and/or contact the upper surface of dielectric layer 132 on both sides of the first gate opening 650. The second segment 1152 extends from the first segment 1151 toward the field plate 160 and the drain electrode 145, and the third segment 1154 extends from the first segment 1151 toward the source electrode 140.

The portion of segment 1151 that contacts the upper surface 103 of the substrate 110 defines the gate channel. The gate channel may be characterized by a gate length 1157 where segment 1151 of the lower gate electrode 152 contacts the semiconductor substrate 110 (i.e., where the gate structure 150 electrically couples to the channel 107). In some embodiments, the gate length 1157 may be between about 0.1 microns and about 1 micron. In other embodiments, the gate length 1157 may be between about 0.02 microns and about 5 microns, though other suitable dimensions may be used.

The conformally-deposited material of the lower gate electrode 152 may be sufficiently thin as to define a void 1155 that extends from the portions of the lower gate electrode 152 that overlie dielectric layer 132 into the first gate opening 650. The sidewalls and bottom extent of the void 1155 are defined by the conformally-deposited material of the lower gate electrode 152 within the first gate opening 650. As mentioned previously, the conformally-deposited material of the lower gate electrode 152 may be thick enough to fill the first gate opening 650, in which case void 1155 is not present.

The conductive field plate 160 is located between the lower gate electrode 152 and the drain electrode 145. The field plate 160 overlies and/or contacts the upper surface of dielectric layer 132. According to one or more embodiments, the conductive field plate 160 has a field plate width 1160 in a range of about 0.1 microns to about 4 microns (e.g., between about 0.2 microns and about 2 microns), although the field plate width 1160 may be narrower or wider, in other embodiments.

Each of the above-described embodiments forms the lower gate electrode 152 and the field plate 160 in a self-aligned manner (i.e., the lower gate electrode 152 and field plate 160 are automatically aligned since a single photoresist mask 810 or 910 was used to define both features). The relative arrangement of the lower gate electrode 152 and the field plate 160 may be characterized by a gate-to-field plate spacing 1155. The gate-to-field plate spacing 155 corresponds to the distance between edge 1153 of the gate electrode 152 and edge 1163 of the field plate 160, according to an embodiment. Using the above-described, self-aligning fabrication stages, the gate-to-field plate spacing 1155 may be made relatively small (e.g., between about 0.2 microns and about 0.5 microns or less), when compared with spacings that are achievable using conventional methods. The reduced gate-to-field plate spacing achievable using embodiments disclosed may result in reduced gate-to-drain capacitance, as well. In various embodiments, the field plate-to-gate distance 1155 may be sub-micronic (e.g. between about 0.1 microns and about 1 micron), or the field plate-to-gate distance 1155 may be greater than 1 micron (e.g., up to about 2 microns or more).

Figure 12:
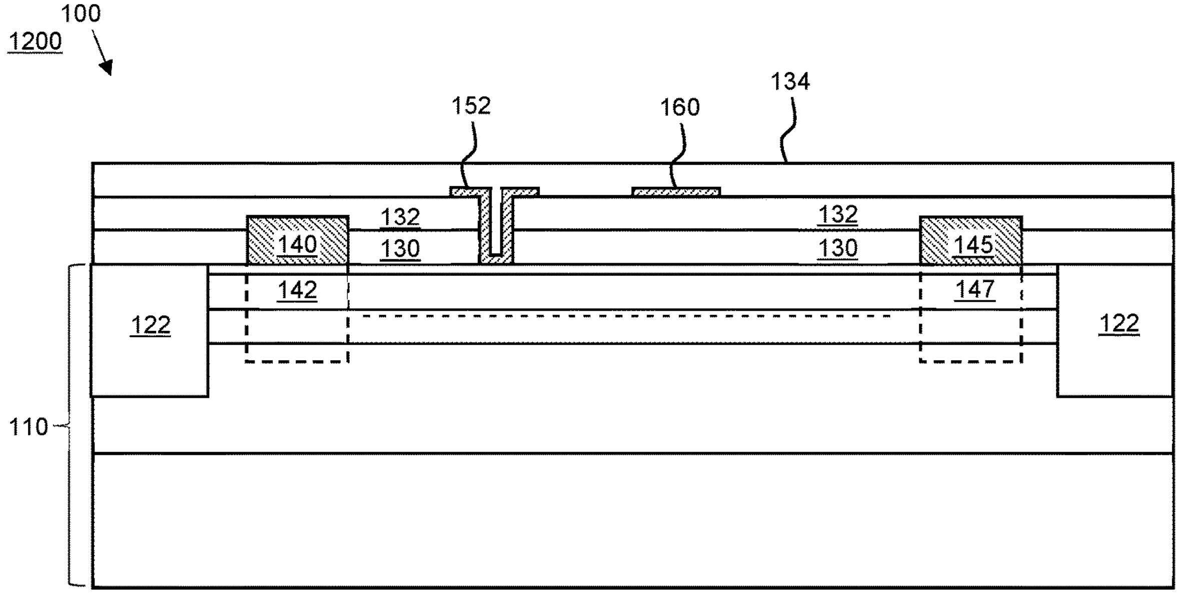

In block 214 of FIG. 2, and as also depicted in fabrication stage 1200 of FIG. 12, the method may continue by forming a third dielectric layer 134 (e.g., an interlayer dielectric) on or over the second dielectric layer 132, the lower gate electrode 152, and the field plate 160. The third dielectric layer 134 may be formed using one or more processes selected from LPCVD, ALD, sputtering, PVD, MBE, CVD, a combination of these or other suitable dielectric deposition technique(s).

The third dielectric layer 134 may be formed from one or more suitable dielectric materials including $SiO_2$, SiN, SiON, $Al_2O_3$, AlN, and $HfO_2$, though other substantially insulating materials may be used. The third dielectric layer 134 may have a thickness of between 200 angstroms and 1000 angstroms. In other embodiments, the third dielectric layer 134 may have a thickness of between 50 angstroms and 10,000 angstroms, though other thicknesses may be used. Desirably, the material selected for the third dielectric layer 134 is a low-k dielectric material and/or the third dielectric layer 134 may be relatively thick, which may help to minimize gate-to-source capacitances associated with the to-be-formed upper gate electrode 154 (FIG. 14). It should be noted that high-voltage, lower-frequency devices may be less affected by gate-to-source capacitance, and thus the dielectric constant and thickness of layer 134 may have less impacts on device performance.

In block 216 of FIG. 2, and as depicted in fabrication stage 1300 of FIG. 13, the method may continue by forming a second gate opening 1350 through the third dielectric layer 134 over the lower gate electrode 152. This includes forming and patterning a photoresist layer 1310 over the semiconductor substrate 110 (and more particularly on or over the third dielectric layer 134). Once dispensed, the photoresist layer 1310 is patterned to form photoresist opening 1320 over the portion of the dielectric layer 134 through which the gate opening 1350 is to be formed, resulting in an upper gate photoresist mask. The photoresist opening 1320 is aligned over the lower gate electrode 152 in that opening 1320 has a first edge that intersects a portion of the lower gate electrode 152 that extends over dielectric layer 132 toward the source electrode 140, and a second edge that intersects a portion of the lower gate electrode 152 that extends over dielectric layer 132 toward the drain electrode 145. The width of opening 1320 is narrower than the combined width of the segments 1152, 1154 of the lower gate electrode 152, and accordingly, opening 1320 can be shifted left or right while still intersecting both segments 1152, 1154. In this way, the portions of the lower gate electrode 152 that extend over the upper surface of the second dielectric layer 132 provide alignment tolerance for the second gate opening 1350 in the patterned photoresist layer 1310.

In an embodiment, the second gate opening 1350 then may be created by etching through the third dielectric layers 134 in the area exposed by the photoresist opening 1320, while stopping at the lower gate electrode 152 (i.e., opening 1350 exposes the lower gate electrode 152). Any dielectric material previously deposited (e.g., in stage 1200) into the void (i.e., void 1155, FIG. 11) of the lower gate electrode 152 also is removed. Etching the third dielectric layer 134 may include performing one or more dry etching processes, such as those discussed in conjunction with forming the source and drain openings in block 206 and FIG. 4. For example, RIE, ICP etching, ECR etching, or another suitable dry etching process may be used. In alternate embodiments, a suitable wet chemical etching process alternatively may be performed. The photoresist layer 1310 may then be removed.

In block 218 of FIG. 2, and as depicted in fabrication stage 1400 of FIG. 14, the method may continue by forming the upper electrode 154 of the gate structure 150. According to one or more embodiments, a lift-off resist process may be used to form upper electrode 154 of the gate structure 150. More specifically, this may include forming and patterning a photoresist layer 1410 over the semiconductor substrate 110 (and more particularly on or over the third dielectric layer 134 and the lower gate electrode 152). Once dispensed, the photoresist layer 1410 is patterned to form an upper gate electrode opening 1420 in the photoresist layer 1410 that encompasses the gate opening 1350 and extends over portions of the third dielectric layer 134 beyond the gate opening 1350 toward the source electrode 140 and the field plate 160.

Once photoresist layer 1410 is deposited and patterned, a gate metal layer 1450 is deposited over the photoresist layer 1410 and into the upper gate electrode opening 1420 (i.e., into the gate opening 1350 and onto the exposed surfaces of the third dielectric layer 134 that are exposed through the gate electrode opening 1420). In one or more embodiments, the various layers of the gate metal layer 1450 may be deposited by evaporation, sputtering, PVD, ALD, or other suitable deposition technique(s).

The upper gate electrode 154 functions to reduce the resistance of the to-be-completed gate structure 150 (i.e., the upper gate electrode 154 reduces the gate resistance). To this end, the conductive layer(s) of the gate metal layer 1450 may include Au, Ag, Al, Cu, Ti and/or other substantially conductive materials. In one or more embodiments, the gate metal layer 1450 may be gold based (e.g., including gold and other materials, or including only gold). The conductive layer(s) of the gate metal layer 1450 may be between about 100 and about 20,000 angstroms in thickness, although other thickness values may be used. Optionally, one or more barrier metal layers may be placed between the lower gate electrode 152 and the gate metal layer 1450, where the barrier metal layer(s) may include materials such as Ni, Pt, Cu, Pd, Cr, W, Ir or other substantially refractive materials that act as a barrier between the lower gate electrode 152 and the gate metal layer 1450.

Once the upper gate metal layer 1450 is deposited, a lift-off process is then performed to remove the photoresist layer 1410 and the portions of the gate metal layer 1450 deposited on the photoresist layer 1410, while leaving the portion of the gate metal layer 1450 deposited into the gate electrode opening 1420 intact.

According to one or more embodiments, once formed, the upper gate electrode 154 may include a vertical stem 1454 that extends into the void 1155 (FIG. 11) of the lower gate electrode 152, and further extends from the lower gate electrode 152 through the third dielectric layer 134 up to and beyond the upper surface of the third dielectric layer 134. The upper gate electrode 154 also includes first and second protruding regions 1455, 1456, which are coupled to the vertical stem 1454 and extend over portions of the upper surface of the third dielectric layer 134 toward the source and drain electrodes 140, 145, respectively. In some embodiments, the first and second protruding regions 1455, 1456 each may extend a distance from the stem 1454 over dielectric layer 134 of between about 0.1 microns and about 0.5 microns, though other suitable distances may be used.

In an alternate embodiment, rather than performing a lift-off resist process, the upper gate electrode 154 may be formed by depositing one or more layers of gate metal over dielectric layer 134, and subsequently defining the upper gate electrode 154 by depositing and patterning photoresist over the gate metal, and then etching the gate metal to form the upper gate electrode 154 on or over the lower gate electrode 152 within the gate opening 1350, including extensions formed on or over the third dielectric layer 134.

Forming the upper gate electrode 154 completes the formation of the two-part gate structure 150, which includes both the lower and upper gate electrodes 152, 154. As discussed above, the lower gate electrode 152 defines the gate channel and gate channel length (i.e., dimension 1157, FIG. 11). In addition, the lower gate electrode 152 defines the gate-to-field plate distance (i.e., distance 1155, FIG. 11). The upper gate electrode 154 functions to lower the overall gate resistance.

Figure 15:
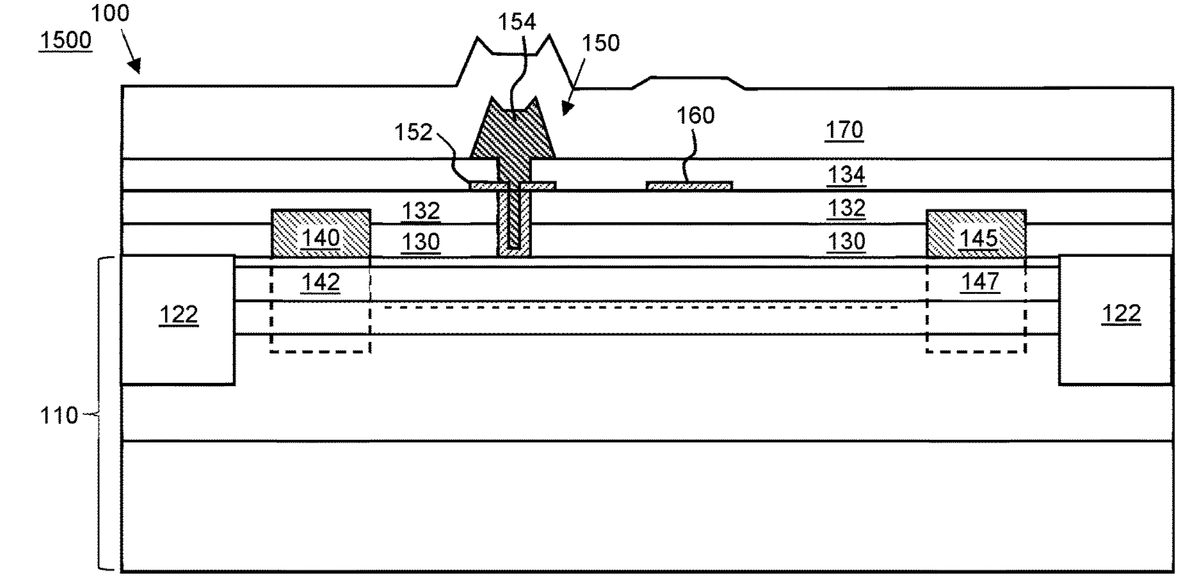

In block 220 of FIG. 2, and as depicted in fabrication stage 1500 of FIG. 15, the method may continue by forming a fourth dielectric layer 170 over the third dielectric layer 134, the source and drain electrodes 140, 145, the field plate 160, and the gate structure 150. In one or more embodiments, the fourth dielectric layer 170 may include one or more layers of SiN, $Al_2O_3$, $SiO_2$, $HfO_2$, indium tin oxide (ITO), diamond, poly-diamond, AlN, boron nitride (BN), SiC, or a combination of these or other insulating materials. Again, it may be desirable for the material(s) of the fourth dielectric layer 170 to be low-k dielectric material(s), so as not to create additional stray capacitances. The total thickness of the layers used to form the fourth dielectric layer 170 may be between about 100 and about 10,000 angstroms in thickness, although other thickness values may be used. The fourth dielectric layer 170 may be deposited using LPCVD, ALD, sputtering, PVD, MBE, CVD (including PECVD, MOCVD, catalytic CVD, HWCVD, ICP CVD, and ECR CVD), a combination of these or other suitable dielectric deposition technique(s).

Figure 16:
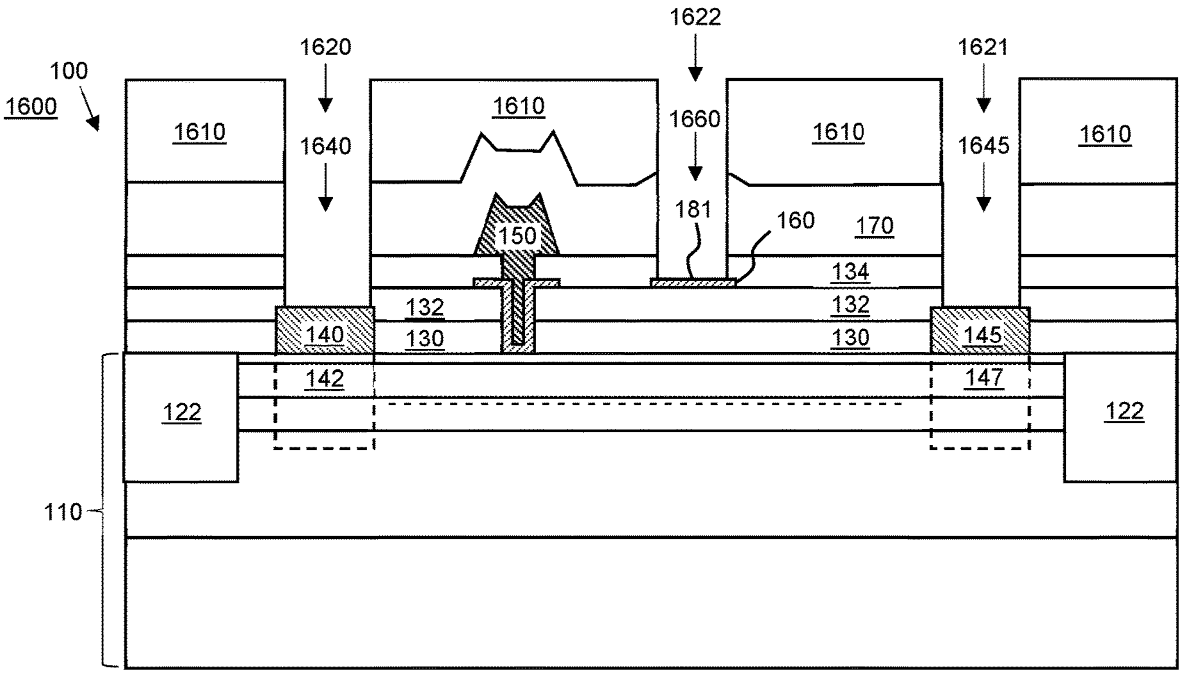

In block 222 of FIG. 2, and as depicted in fabrication stage 1600 of FIG. 16, the method may continue by forming and patterning a photoresist layer 1610 over the fourth dielectric layer 170. More specifically, once dispensed, the photoresist layer 1610 is patterned to form photoresist openings 1620, 1621, and 1622 over the source electrode 140, the drain electrode 145, and the field plate 160, respectively.

In an embodiment, a source contact opening 1640, a drain contact opening 1645, and one or more field plate openings 1660 then may be created by etching through the fourth dielectric layer 170 in areas exposed by the photoresist openings 1620-1622, while stopping at the upper surfaces of the source electrode 140, the drain electrode 145, and the field plate 160. The source and drain contact openings 1640, 1645 expose upper surfaces of the source and drain electrodes 140, 145, respectively.

The one or more field plate openings 1660 expose one or more connection point(s) 181 along the length of the field plate 160 (i.e., the dimension extending along an axis perpendicular to the plane of GaN HFET device 100 shown in FIG. 1), according to various embodiments. In some embodiments, the field plate opening 1660 is a single continuous opening along the entire length of the field plate 160, and thus the field plate opening 1660 exposes a single elongated connection point 181. In other embodiments, multiple field plate openings 1660, which are spatially-separated by portions of the fourth dielectric layer 170, may be formed in multiple distinct regions along the field plate length. In such embodiments, a connection-to-connection distance between adjacent connection points 181 along the field plate 160 may be a fixed value of between about 5 microns and about 500 microns, although other shorter or longer values for the connection-to-connection distance may be used.

Etching the fourth dielectric layer 170 preferably includes performing one or more dry etching processes, such as RIE, ICP etching, ECR etching, or another suitable dry etching process. In alternate embodiments, a suitable wet chemical etching process alternatively may be performed. According to one or more embodiments, suitable dry etching techniques may use one or more of $SF_6$, $SF_6/O_2$, $C_2F_6$, $CF_4$, $CH_3F$, $CHF_3$ or other chemistries. The patterned photoresist layer 1610 is removed before proceeding to the next fabrication stage.

Figure 17:
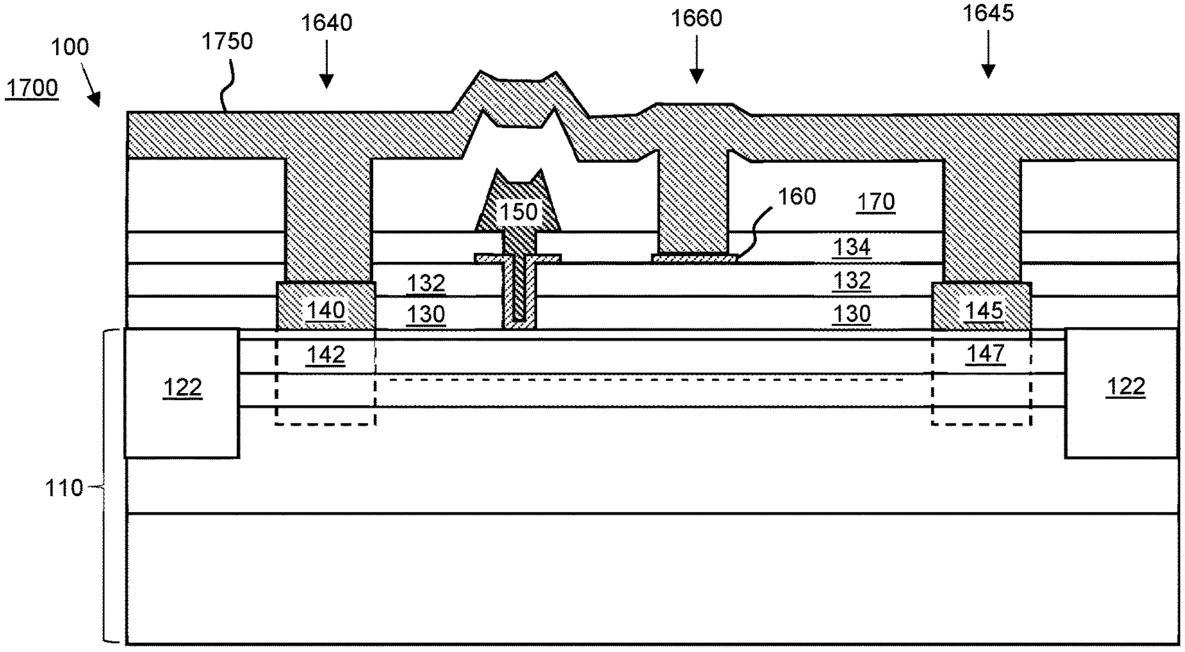

In block 224 of FIG. 2, and as depicted in fabrication stage 1700 of FIG. 17, the method may continue by depositing a second conductive layer 1750 on or over the fourth dielectric layer 170 and exposed portions of the source and drain regions 142, 147 and the field plate 160. The second conductive layer 1750 may correspond, for example, to the lowest metal interconnect layer (M0) of the device 100.

According to an embodiment, the second conductive layer 1750 is blanket deposited over the upper surface of the fourth dielectric layer 170, and over portions of the source electrode 140, the drain electrode 145, and the field plate 160 that are exposed through the openings 1640, 1645, and 1660 in the fourth dielectric layer 170. In one or more embodiments, the second conductive layer 1750 may be deposited by sputtering, evaporation, PVD, or other suitable deposition techniques. In one or more embodiments, the second conductive layer 1750 may contain one or more materials selected from Ti, Al, TiN, TiW, TiAl, and/or TiWN, Au, Mo, Ni, Si, Ge, Pt, Ta, Cu, Au, Ag, and/or other suitable materials.

Figure 18:
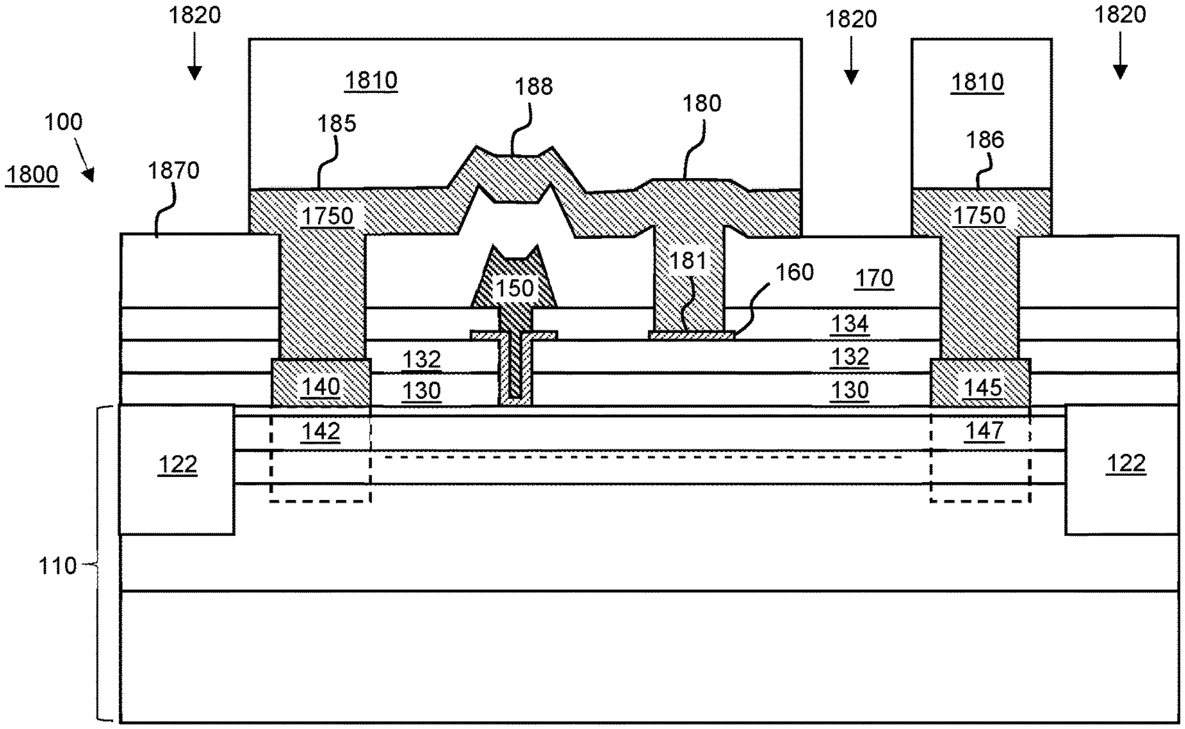

In block 226 of FIG. 2, and as depicted in fabrication stages 1800 of FIG. 18, the method may continue by patterning the second conductive layer 1750 to form source metallization 185, drain metallization 186, and a conductive connection 180 between the field plate 160 and the source metallization 185 (i.e., between the field plate 160 and the source region 142).

Patterning the second conductive layer 1750 includes forming and patterning a photoresist layer 1810 over the second conductive layer 1750. More specifically, once dispensed, the photoresist layer 1810 is patterned to form photoresist openings 1820 over portions of the second conductive layer 1750 outside of the desired locations of the source and drain metallization 185, 186 and the conductive field plate-to-source connection 180. Said another way, the photoresist layer 1810 is patterned to protect portions of the second conductive layer 1750 over the source and drain electrodes 140, 145, over the field plate 160, and between the field plate 160 and the source electrode 140.

Portions of layers the second conductive layer 1750 that are exposed through openings 1820 in the photoresist layer 1810 are then removed by etching through the second conductive layer 1750 in areas exposed by the photoresist openings 1820, while stopping at the upper surface 1870 of the second dielectric layer 170. Etching the second conductive layer 1750 preferably includes performing a dry etching process, such as RIE, ICP etching, ECR etching, or other suitable dry etching processes. For example, suitable dry etching techniques may use one or more of $SF_6$, $C_2F_6$, $CF_4$, $CHF_3$ or other chemistries like BCl3/Cl2, according to an embodiment. In an alternate embodiment, a suitable wet chemical etching process may be performed.

Figure 19:
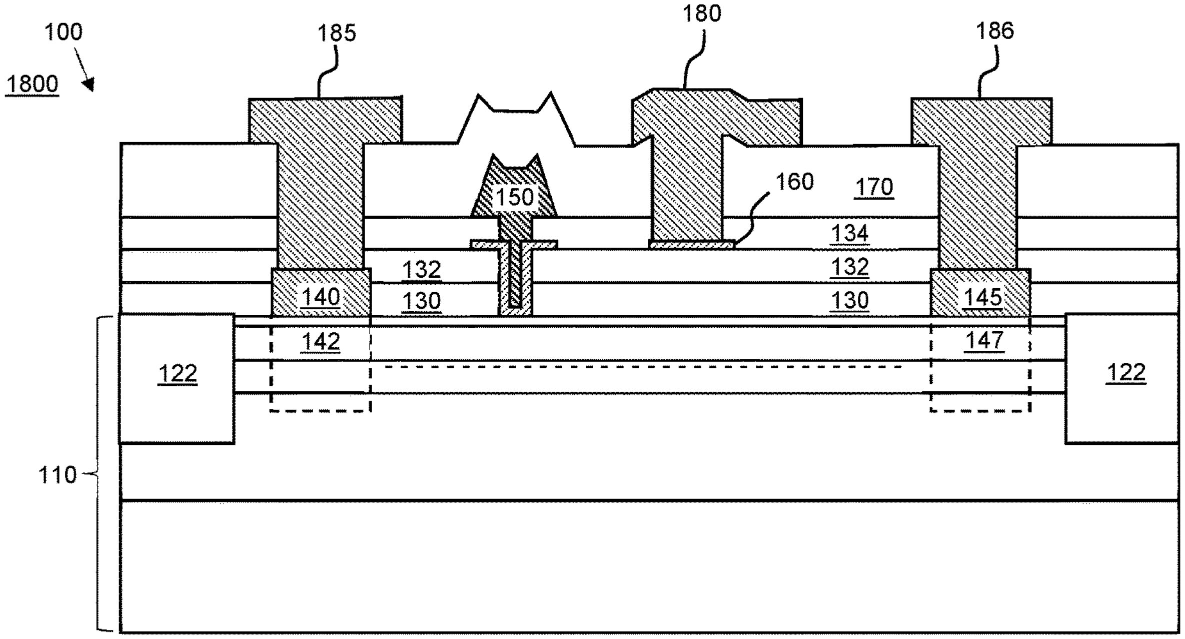

The etching process results in the formation of the source and drain metallization 185, 186 and the conductive connection 180 between the field plate 160 and the source metallization 185. As mentioned previously, in some embodiments, the field plate-to-source connection 180 includes conductive straps 188, which include relatively-thin conductors spaced along the transistor finger that extend, periodically, over the gate structure 150 to electrically couple multiple connection points 181 along the field plate 160 to the source electrode 140. FIG. 18 shows a cross-section through one such conductive strap 188, while FIG. 19 shows a cross-section through a point along the transistor finger where a strap is not present. As can be seen in FIG. 19, where the strap is not present, the conductive layer 1750 does not extend from the field plate 160 to the source electrode 140 over the gate structure 150. In other embodiments, rather than including conductive straps 188, the field plate-to-source connection 180 may include a solid, continuous conductive structure between the field plate 160 and the source electrode 140. The patterned photoresist layer 1810 is removed, resulting in semiconductor device 100 depicted in FIG. 1.

In block 228 of FIG. 2, and as depicted in FIG. 1, fabrication of device 100 may then be completed by forming additional dielectric layers and conductive layers (e.g., M1, M2, etc.) over the second conductive layer 1750 and the fourth dielectric layer 170 to provide selective electrical connections between the device 100 and other features of the semiconductor device 100 (e.g., input/output bondpads, other transistor fingers, and so on). The method of FIG. 2 may then end.

Various alternate embodiments of device 100 and the method of its formation will now be discussed in conjunction with FIGS. 20-28. Referring first to FIGS. 20-23, an embodiment of a device 100' is disclosed that is identical in many respects to device 100 (FIG. 1), except that device 100' includes both a lower field plate 160 (or first field plate), as described above, and an upper field plate 162 (or second field plate) (FIGS. 21-23), formed on and over the lower field plate 160. According to one or more embodiments, the upper field plate 162 may be formed during the same fabrication stages as are used to form the previously-described upper gate electrode 154.

Referring also to FIG. 2, forming device 100' may begin by performing the previously-described blocks 202-214 associated with fabrication stages 300-1200 (FIGS. 3-12). The details and alternate embodiments discussed in conjunction with blocks 202-214, fabrication stages 300-1200, and FIGS. 3-12 apply also to the fabrication of device 100'. For purposes of brevity, those details and alternate embodiments are not repeated here, but are intended to be incorporated into this description of device 100'. Formation of device 100' may start with the partially-formed device 100 shown in FIG. 12 (i.e., a partially-formed device on which the third dielectric layer 134 has just been formed).

Figure 20:
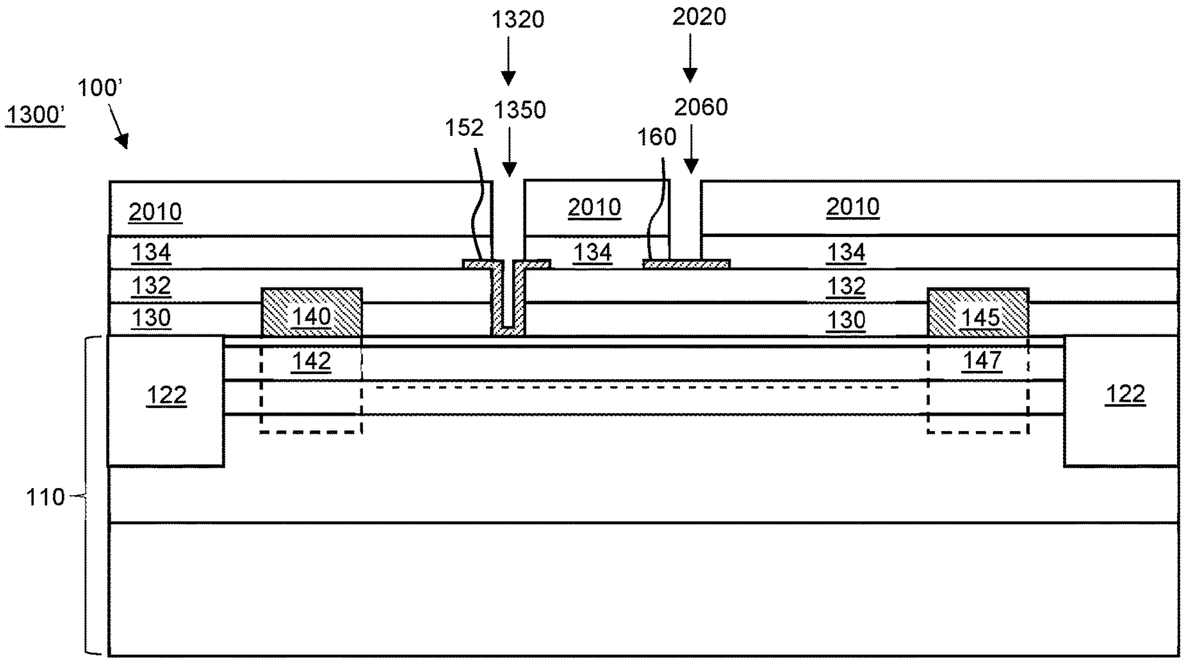
FIGS. 20, 21, 22, and 23 are cross-sectional, side views of partially formed versions of an alternate embodiment of a transistor at various stages of fabrication.

As depicted in FIG. 20, fabrication of device 100' continues with alternate fabrication stage 1300' by forming a first field plate opening 2060 over the field plate 160 through the third dielectric layer 134 simultaneously with forming the above-described second gate opening 1350 through the third dielectric layer 134 over the lower gate electrode 152. This includes forming and patterning a photoresist layer 2010 over the semiconductor substrate 110 (and more particularly on or over the third dielectric layer 134). Once dispensed, the photoresist layer 2010 is patterned to form photoresist opening 1320 over the portion of the dielectric layer 134 through which the gate opening 1350 is to be formed, and also to form photoresist opening 2020 over the field plate 160. In other words, the photoresist opening 1320 is aligned over the lower gate electrode 152, and the photoresist opening 2020 is aligned over the lower field plate 160.

In an embodiment, the first field plate opening 2060 and the second gate opening 1350 then may be created by etching through the third dielectric layers 134 in the areas exposed by the photoresist openings 1320, 2020, while stopping at the lower gate electrode 152 and the field plate 160 (i.e., openings 1350 and 2060 expose the lower gate electrode 152 and the lower field plate 160). It may be noted here that it is not essential for the second gate opening 1350 or the first field plate opening 2060 to be perfectly centered over the lower gate electrode 152 or the lower field plate 160. In fact, it may be desirable to move opening 2060 toward the drain electrode 145 in order to reduce the electric field at the drain-side edge of the lower field plate 160, and thus potentially to improve dielectric reliability and improve breakdown voltage of the device 100'. Upon completion of previously-described dry and/or wet etch processes (see, e.g., fabrication stage 1300, above), the photoresist layer 2010 may then be removed.

Figure 21:
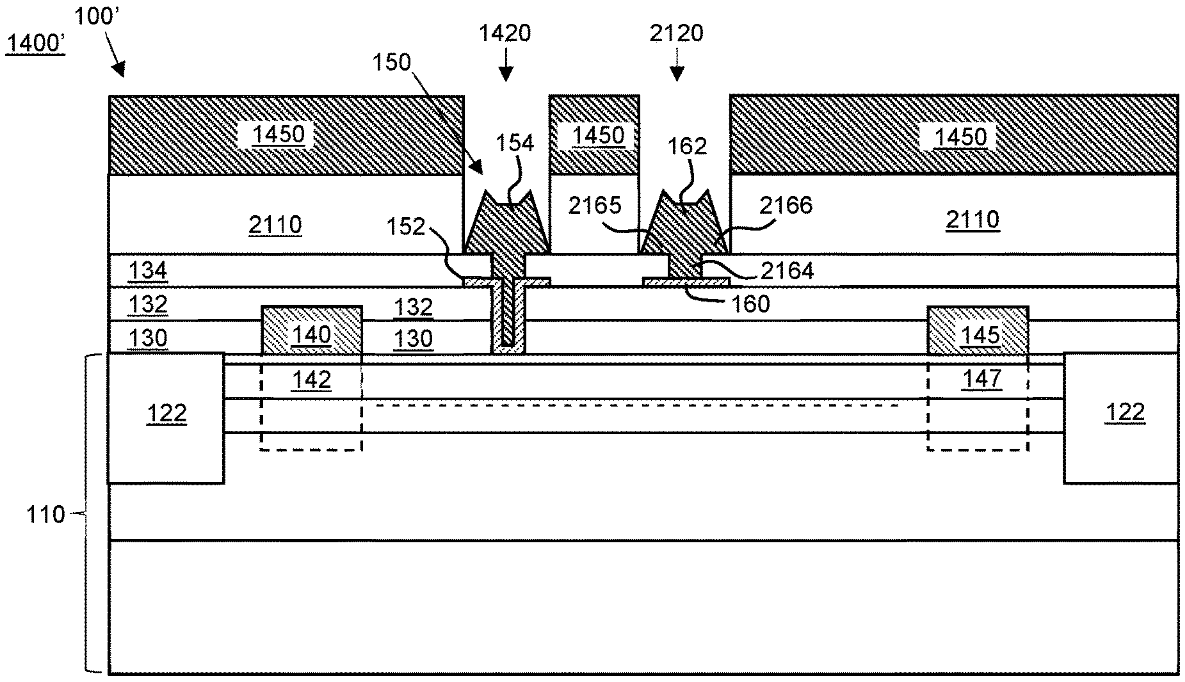

As depicted in FIG. 21, fabrication of device 100' continues with alternate fabrication stage 1400' by forming an upper field plate 162 on the field plate 160 simultaneously with forming the above-described upper electrode 154 of the gate structure 150. According to one or more embodiments, a lift-off resist process may be used to form upper electrode 154 and upper field plate 162. More specifically, this may include forming and patterning a photoresist layer 2110 over the semiconductor substrate 110 (and more particularly on or over the third dielectric layer 134, the lower gate electrode 152, and the lower field plate 160). Once dispensed, the photoresist layer 2110 is patterned to form an upper gate electrode opening 1420 in the photoresist layer 2110 that encompasses (i.e., is wider than) and is aligned over the gate opening 1350 and extends over portions of the third dielectric layer 134 beyond the gate opening 1350 toward the source electrode 140 and the lower field plate 160. In addition, the photoresist layer 2110 is patterned to form an upper field plate opening 2120 in the photoresist layer 2110 that encompasses (i.e., is wider than) and is aligned over the first field plate opening 2060 and extends over portions of the third dielectric layer 134 beyond the first field plate opening 2060 toward the gate structure 150 and the drain electrode 145.

Once photoresist layer 2110 is deposited and patterned, the above-described gate metal layer 1450 is deposited over the photoresist layer 2110, into the upper gate electrode opening 1420, and into the upper field plate opening 2120 (i.e., into the field plate opening 2060 and onto the exposed surfaces of the third dielectric layer 134 that are exposed through the upper field plate opening 2120). As discussed previously, in one or more embodiments, the various layers of the gate metal layer 1450 may be deposited by evaporation, sputtering, PVD, ALD, or other suitable deposition technique(s). Further, the conductive layer(s) of the gate metal layer 1450 may include Au, Ag, Al, Cu, Ti and/or other substantially conductive materials, and one or more barrier metal layers (e.g., Ni, Pt, TiN, TiW, Cu, Pd, Cr, W, Ir or other substantially refractive materials) may be placed between the lower gate electrode 152 and the field plate 160 and the gate metal layer 1450.

Once the upper gate metal layer 1450 is deposited, a lift-off process is then performed to remove the photoresist layer 2110 and the portions of the gate metal layer 1450 deposited on the photoresist layer 2110, while leaving the portion of the gate metal layer 1450 deposited into the gate electrode opening 1420 and into the upper field plate opening 2120 intact.

As described above, the upper gate electrode 154 may have a T-shaped cross-section (e.g., including a vertical stem 1454 and protruding regions 1455, 1456, FIG. 14). Similarly, according to one or more embodiments, once formed, the upper field plate 162 also may include a vertical stem 2164 that extends from the lower field plate 160 up to and beyond the upper surface of the third dielectric layer 134. The upper field plate 162 also includes first and second protruding regions 2165, 2166, which are coupled to the vertical stem 2164 and extend over portions of the upper surface of the third dielectric layer 134 toward the source and drain electrodes 140, 145, respectively. The protruding regions 2165, 2166 of the upper field plate 162, which extend over the third dielectric layer 134, may function as a second field plate. The protruding region 2166 that extends toward the drain electrode 145 may beneficially affect the electric field distribution, and thus may improve device performance.

In an alternate embodiment, rather than performing a lift-off resist process, the upper gate electrode 154 and the upper field plate 162 may be formed by depositing one or more layers of gate metal over dielectric layer 134, and subsequently defining the upper gate electrode 154 and the upper field plate 162 by depositing and patterning photoresist over the gate metal, and then etching the gate metal to form the upper gate electrode 154 on or over the lower gate electrode 152 within the gate opening 1350, and to form the upper field plate 162 on or over the lower field plate 160 within the upper field plate opening 2060, including extensions formed on or over the third dielectric layer 134.

Figure 22:
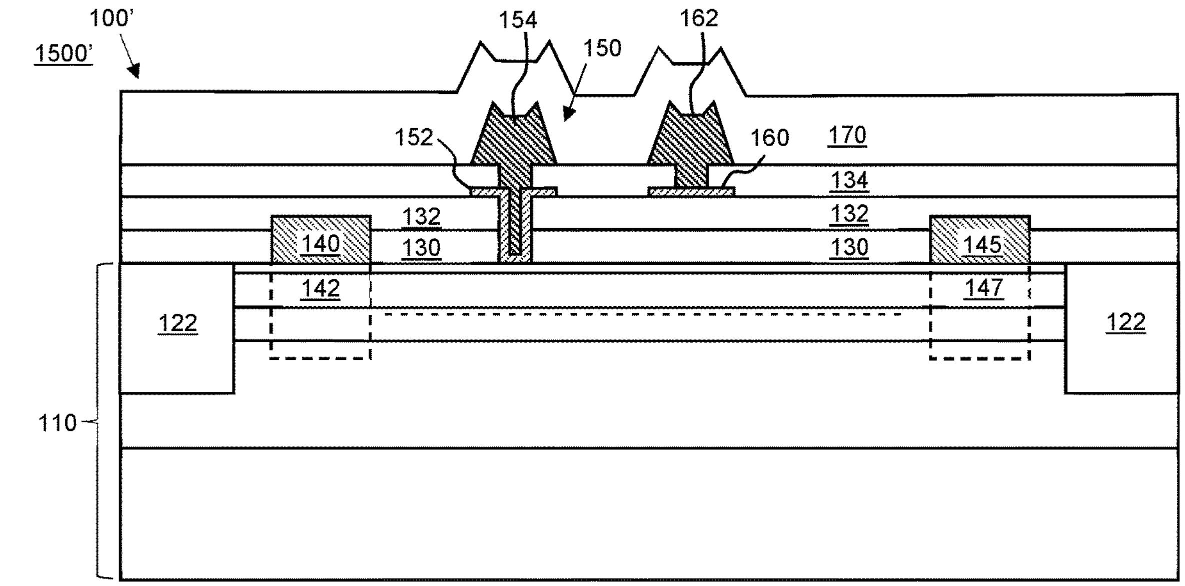

As depicted in FIG. 22, fabrication of device 100' continues with alternate fabrication stage 1500' by forming the fourth dielectric layer 170 over the third dielectric layer 134, the source and drain electrodes 140, 145, the upper field plate 162, and the gate structure 150. The materials and fabrication techniques for forming the fourth dielectric layer 170 were described in detail in conjunction with FIG. 15, and those details are incorporated into this description of fabrication stage 1500'.

Figure 23:
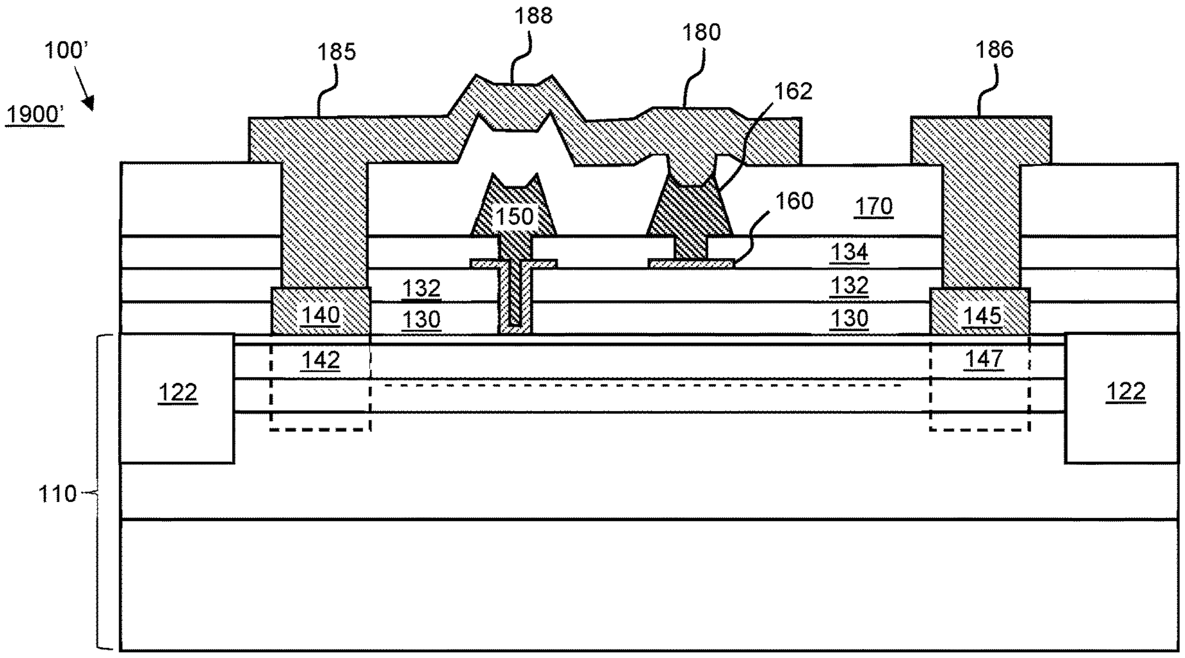

As depicted in FIG. 23, fabrication of device 100' continues up to and including alternate fabrication stage 1900' by forming openings through the fourth dielectric layer 170 that expose the source electrode 140, the drain electrode 145, and the upper field plate 162 (see details of fabrication stage 1600, FIG. 16). A second conductive layer (e.g., layer 1750) is then deposited over the fourth dielectric layer 170 and into the above-described openings (see details of fabrication stage 1700, FIG. 17). The second conductive layer is then patterned, resulting in the formation of the source and drain metallization 185, 186 and the conductive connection 180 between the upper and lower field plates 162, 160 and the source metallization 185 (see details of fabrication stage 1800, FIGS. 18, 19). As mentioned previously, in some embodiments, the field plate-to-source connection 180 includes conductive straps 188, while in other embodiments, the field plate-to-source connection 180 may include a solid, continuous conductive structure between the upper field plate 162 and the source electrode 140.

In the previously-described embodiments of device 100 and 100', the upper gate electrode 154 and the upper field plate 162 have substantially-symmetrical, T-shaped cross-sections. More specifically, for the upper gate electrode 154, the protruding regions 1455, 1456 (FIG. 14) extend approximately the same distance from the vertical stem 1454 over the upper surface of the third dielectric layer 134 toward the source and drain electrodes 140, 145, respectively. Similarly, for the upper field plate 162, the protruding regions 2165, 2166 (FIG. 21) extend approximately the same distance from the vertical stem 2164 over the upper surface of the third dielectric layer 134 toward the source and drain electrodes 140, 145, respectively.

In some alternate embodiments, the second gate electrode 154 and/or the second field plate 162 may be asymmetrical. For example, referring now to FIGS. 24 and 25, an embodiment of a device 100" is disclosed that is identical in many respects to device 100' (FIG. 23), except that device 100" includes an asymmetrical upper gate electrode 154' and an asymmetrical upper field plate 162'.

Referring also to FIG. 2, forming device 100" may begin by performing the previously-described blocks 202-214 associated with fabrication stages 300-1200 (FIGS. 3-12), and the process may continue by performing the previously-described fabrication stage 1300' (FIG. 20). The details and alternate embodiments discussed in conjunction with blocks 202-214, fabrication stages 300-1200, 1300', and FIGS. 3-12 and 20 apply also to fabrication of device 100". For purposes of brevity, those details and alternate embodiments are not repeated here, but are intended to be incorporated into this description of device 100". Formation of device 100" may start with the partially-formed device 100' shown in FIG. 20 (i.e., a partially-formed device in which the upper gate opening 1350 and the upper field plate opening 2060 have been formed).

Figure 24:
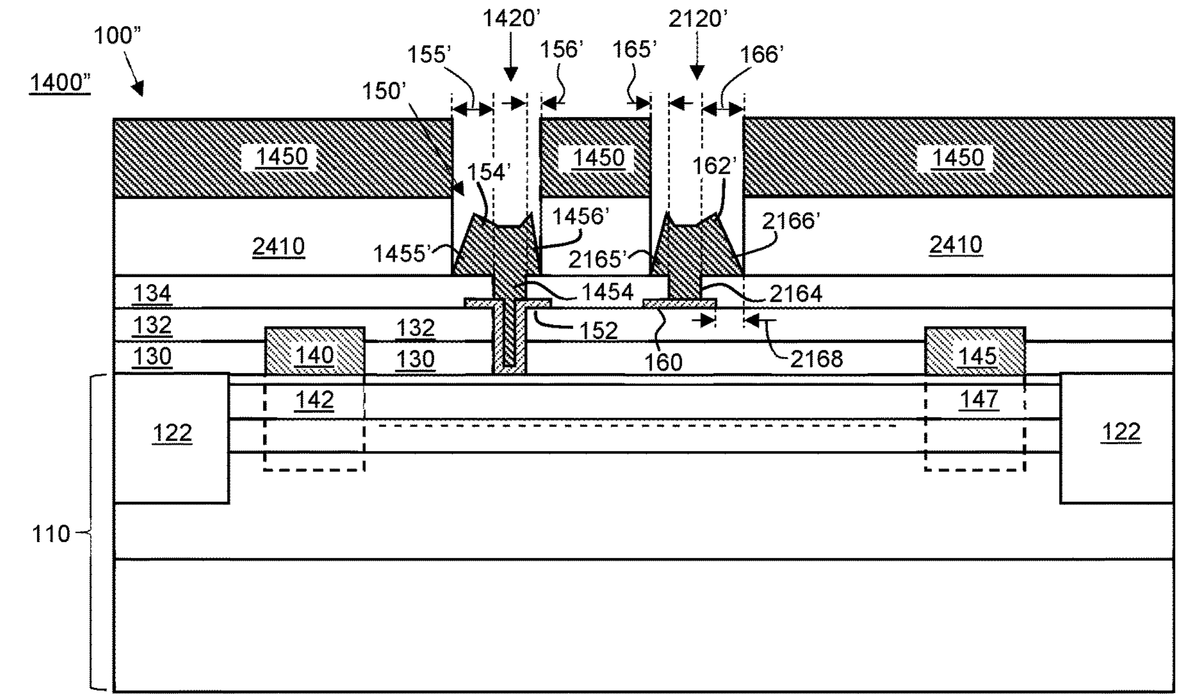
FIGS. 24 and 25 are cross-sectional, side views of partially formed versions of another alternate embodiment of a transistor at various stages of fabrication.

As depicted in FIG. 24, fabrication of device 100" continues with alternate fabrication stage 1400" by forming an asymmetrical upper field plate 162' on the field plate 160 simultaneously with forming an asymmetrical upper electrode 154' of the gate structure 150. According to one or more embodiments, a lift-off resist process may be used to form asymmetrical upper electrode 154' and asymmetrical upper field plate 162'. More specifically, this may include forming and patterning a photoresist layer 2410 over the semiconductor substrate 110 (and more particularly on or over the third dielectric layer 134, the lower gate electrode 152, and the lower field plate 160). Once dispensed, the photoresist layer 2410 is patterned to form an upper gate electrode opening 1420' in the photoresist layer 2410 that encompasses the gate opening 1350, but which extends asymmetrically over portions of the third dielectric layer 134 beyond the gate opening 1350 toward the source electrode 140 and the lower field plate 160. In addition, the photoresist layer 2410 is patterned to form an upper field plate opening 2120' in the photoresist layer 2410 that encompasses the first field plate opening 2060, but which also extends asymmetrically over portions of the third dielectric layer 134 beyond the first field plate opening 2060 toward the gate structure 150 and the drain electrode 145. As will be described below, the asymmetrical orientation of the upper gate electrode opening 1420' and the upper field plate opening 2120' will result in an asymmetrically-shaped upper gate electrode 154' and an asymmetrically-shaped upper field plate 162'.

More specifically, once photoresist layer 2410 is deposited and patterned, the above-described gate metal layer 1450 is deposited over the photoresist layer 2410, into the upper gate electrode opening 1420', and into the upper field plate opening 2120' (i.e., into the field plate opening 2060 and onto the exposed surfaces of the third dielectric layer 134 that are exposed through the upper field plate opening 2120'). Embodiments of the various layers of the gate metal layer 1450 and methods of their deposition were described above, and those details are incorporated here.

Once the upper gate metal layer 1450 is deposited, a lift-off process is then performed to remove the photoresist layer 2410 and the portions of the gate metal layer 1450 deposited on the photoresist layer 2410, while leaving the portion of the gate metal layer 1450 deposited into the asymmetrical gate electrode opening 1420' and into the asymmetrical upper field plate opening 2120' intact.

In contrast with the previously-described embodiments, the asymmetrical upper gate electrode 154' has an asymmetrical T-shaped cross-section, including a vertical stem 1454 and protruding regions 1455', 1456'. As can be observed in FIG. 24, protruding region 1455' extends a first distance 155' from the vertical stem 1454 toward the source electrode 140, and protruding region 1456' extends a second distance 156' from the vertical stem 1454 toward the drain electrode 145, where the first distance 155' is significantly larger than the second distance 156' (e.g., from 20-100 percent larger). Extending the upper gate electrode 154' as described above may help to reduce the gate resistance.

Similarly, in contrast with the previously-described embodiments, the asymmetrical upper field plate 162' has an asymmetrical T-shaped cross-section, including a vertical stem 2164 and protruding regions 2165', 2166'). As can be observed in FIG. 24, protruding region 2165' extends a third distance 165' from the vertical stem 2164 toward the source electrode 140, and protruding region 2166' extends a fourth distance 166' from the vertical stem 2164 toward the drain electrode 145, where the third distance 165' is significantly larger than the fourth distance 166' (e.g., from 20-80 percent smaller). The asymmetrical T-shaped upper source electrode 154' and upper field plate 162' enables the distance between the upper source electrode 154' and upper field plate 162' to be adjusted (e.g., increased), so as to adjust (e.g., reduce) the gate-to-source capacitance for the device 100". In addition, protruding region 2166' may be formed to extend a distance 2168 beyond the drain-side edge of the lower field plate 160, which may result in improved dielectric reliability and improved breakdown voltage of the device 100".

As indicated previously, reduced capacitance also may be achieved through selection of a low-k material for the third dielectric layer 134 and/or by increasing the thickness of the third dielectric layer 134. Again, it should be noted that high-voltage, lower-frequency devices may be less affected by gate-to-source capacitance, and thus the dielectric constant and thickness of layer 134 may be less impactful on the performance of the device 100". Essentially, for a relatively thick third dielectric layer 134, gate-to-source capacitance and drain-to-source capacitance penalties may be relatively low, despite the protrusions 1455' and 2166' extending significant distances 155', 166' toward the source and drain electrodes 140, 145, respectively.

In an alternate embodiment, rather than performing a lift-off resist process, the asymmetrical upper gate electrode 154' and the asymmetrical upper field plate 162' may be formed by depositing one or more layers of gate metal over dielectric layer 134, and subsequently defining the upper gate electrode 154' and the upper field plate 162' by depositing and patterning photoresist over the gate metal, and then etching the gate metal to form the upper gate electrode 154' on or over the lower gate electrode 152 within the gate opening 1350, and to form the upper field plate 162' on or over the lower field plate 160 within the upper field plate opening 2060, including extensions formed on or over the third dielectric layer 134.

Figure 25:
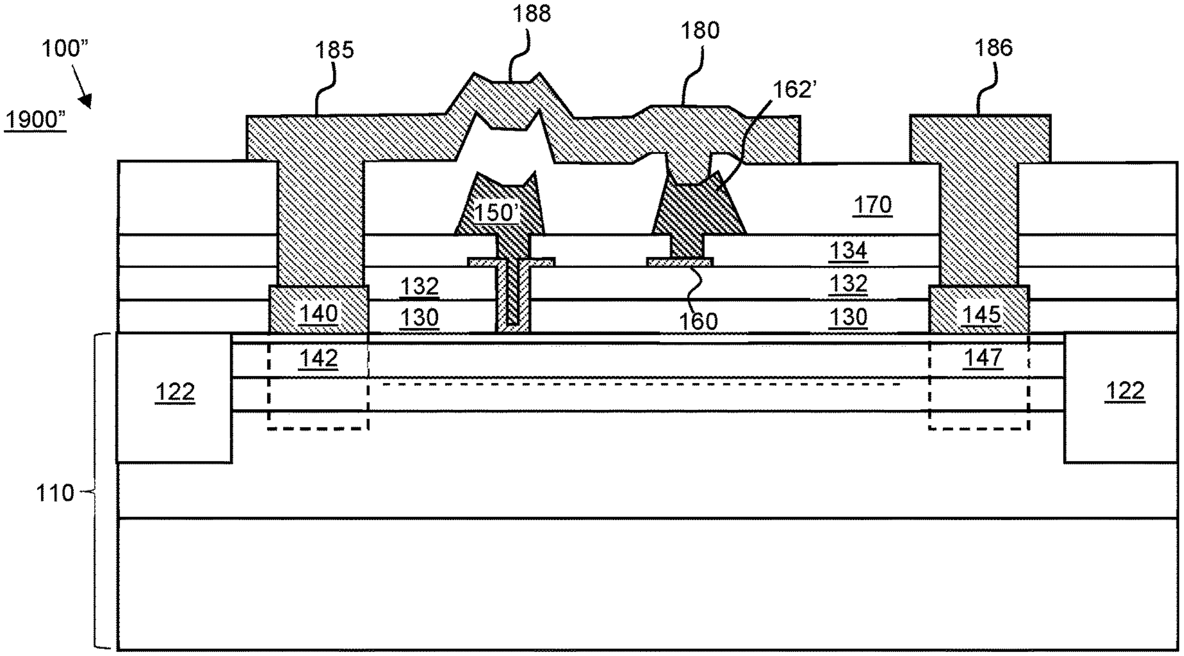

As depicted in FIG. 25, fabrication of device 100" continues up to and including alternate fabrication stage 1900" by forming the fourth dielectric layer 170 over the third dielectric layer 134, the source and drain electrodes 140, 145, the upper field plate 162', and the upper gate electrode 154' (see details of fabrication stages 1500, 1500', FIGS. 15, 22), and forming openings through the fourth dielectric layer 170 that expose the source electrode 140, the drain electrode 145, and the upper field plate 162' (see details of fabrication stage 1600, FIG. 16). A second conductive layer (e.g., layer 1750) is then deposited over the fourth dielectric layer 170 and into the above-described openings (see details of fabrication stage 1700, FIG. 17). The second conductive layer is then patterned, resulting in the formation of the source and drain metallization 185, 186 and the conductive connection 180 between the upper and lower field plates 162', 160 and the source metallization 185 (see details of fabrication stage 1800, FIGS. 18, 19). As mentioned previously, in some embodiments, the field plate-to-source connection 180 includes conductive straps 188, while in other embodiments, the field plate-to-source connection 180 may include a solid, continuous conductive structure between the upper field plate 162 and the source electrode 140.

In each of the above-described embodiments, the upper gate electrode (e.g., electrodes 150, 150') have a T-shaped cross-section. In other embodiments, the upper gate electrode may be formed using a process that results in a different cross-sectional shape. For example, referring now to FIGS. 26-28, an embodiment of a device 100''' is disclosed that is identical in many respects to device 100 (FIG. 1), except that device 100''' includes an upper gate electrode 154" with a trapezoidal cross-sectional shape and no protruding regions. The simpler cross-sectional shape of the upper gate electrode 154" may be achieved using a single photoresist process (i.e., fabrication step 1400''', described below), rather than using two photoresist processes as is needed to form a T-shaped gate electrode. Accordingly, to simplify the manufacturing process, it may be desirable to include an upper gate electrode 154" with a trapezoidal shape.

Referring also to FIG. 2, forming device 100''' may begin by performing the previously-described blocks 202-214 associated with fabrication stages 300-1200 (FIGS. 3-12). The details and alternate embodiments discussed in conjunction with blocks 202-214, fabrication stages 300-1200, and FIGS. 3-12 apply also to fabrication of device 100'''. For purposes of brevity, those details and alternate embodiments are not repeated here, but are intended to be incorporated into this description of device 100'''. Formation of device 100''' may start with the partially-formed device 100 shown in FIG. 12 (i.e., a partially-formed device on which the third dielectric layer 134 has just been formed).

Figure 26:
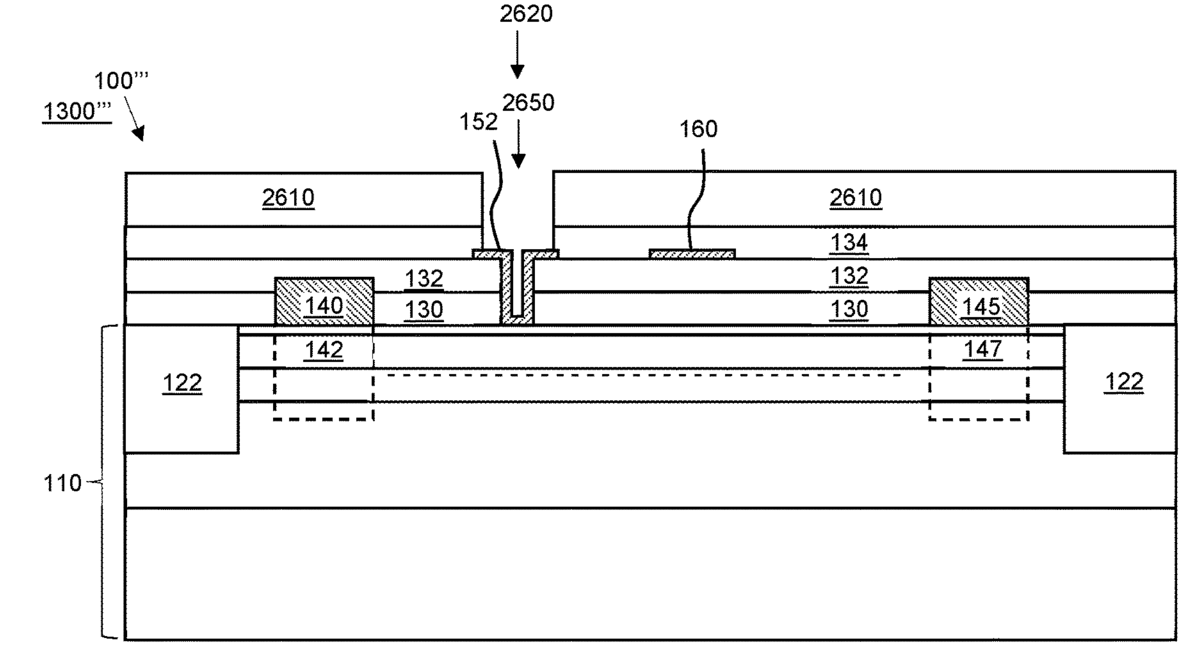
FIGS. 26, 27, and 28 are cross-sectional, side views of partially formed versions of yet another alternate embodiment of a transistor at various stages of fabrication.

As depicted in FIG. 26, fabrication of device 100''' continues with alternate fabrication stage 1300''' by forming a second gate opening 2650 through the third dielectric layer 134 over the lower gate electrode 152. It should be noted here that the second gate opening 2650 in FIG. 26 is significantly wider than the second gate openings 1350 shown, for example, in FIGS. 13 and 20.

Forming the second gate opening 2650 includes forming and patterning a photoresist layer 2610 over the semiconductor substrate 110 (and more particularly on or over the third dielectric layer 134). Once dispensed, the photoresist layer 2610 is patterned to form photoresist opening 2620 over the portion of the dielectric layer 134 through which the gate opening 2650 is to be formed.

In an embodiment, the second gate opening 2650 then may be created by etching through the third dielectric layers 134 in the areas exposed by the photoresist opening 2620, while stopping at the lower gate electrode 152. Unlike the previously-described embodiments, after completing previously-described dry and/or wet etch processes (see, e.g., fabrication stage 1300, above), the photoresist layer 2610 may be retained for the next fabrication step.

Figure 27:
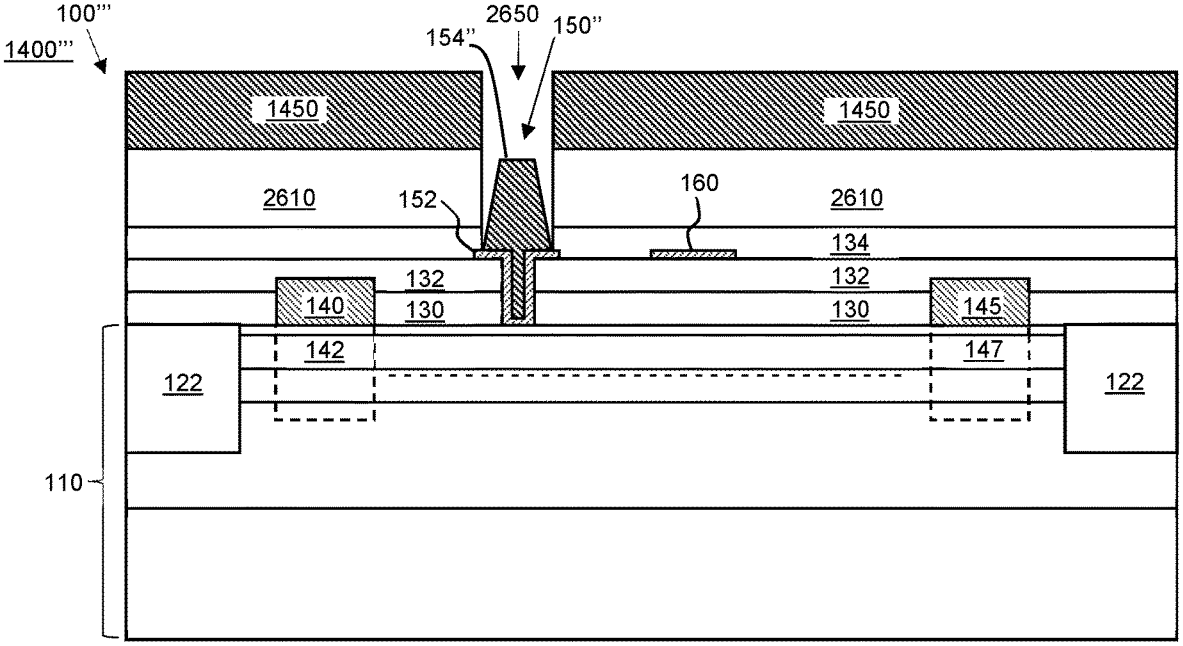

As depicted in FIG. 27, fabrication of device 100''' continues with alternate fabrication stage 1400''' by forming an upper electrode 154" of the gate structure 150". According to one or more embodiments, a lift-off resist process may be used to form upper electrode 154". The lift-off resist process may use the same patterned photoresist layer 2610 as was used in the previous fabrication stage. The above-described gate metal layer 1450 is deposited over the photoresist layer 2610, into the upper gate electrode opening 2650. As discussed previously, in one or more embodiments, the various layers of the gate metal layer 1450 may be deposited by evaporation, sputtering, PVD, ALD, or other suitable deposition technique(s). Further, the conductive layer(s) of the gate metal 1450 may include Au, Ag, Al, Cu, Ti and/or other substantially conductive materials, and one or more barrier metal layers (e.g., Ni, Pt, Cu, TiN, TaN, Pd, Cr, W, Ir or other substantially refractive materials) may be placed between the lower gate electrode 152 and the gate metal layer 1450.

Once the upper gate metal layer 1450 is deposited, a lift-off process is then performed to remove the photoresist layer 2610 and the portions of the gate metal layer 1450 deposited on the photoresist layer 2610, while leaving the portion of the gate metal layer 1450 deposited into the gate electrode opening 2650 intact. As shown in FIG. 27, the upper gate electrode 154" may have a trapezoid-shaped cross-section, rather than the T-shaped cross-section of the previously-described embodiments.

In an alternate embodiment, rather than performing a lift-off resist process, the upper gate electrode 154" may be formed by depositing one or more layers of gate metal over dielectric layer 134, and subsequently defining the upper gate electrode 154" by depositing and patterning photoresist over the gate metal, and then etching the gate metal to form the upper gate electrode 154" on or over the lower gate electrode 152.

Figure 28:
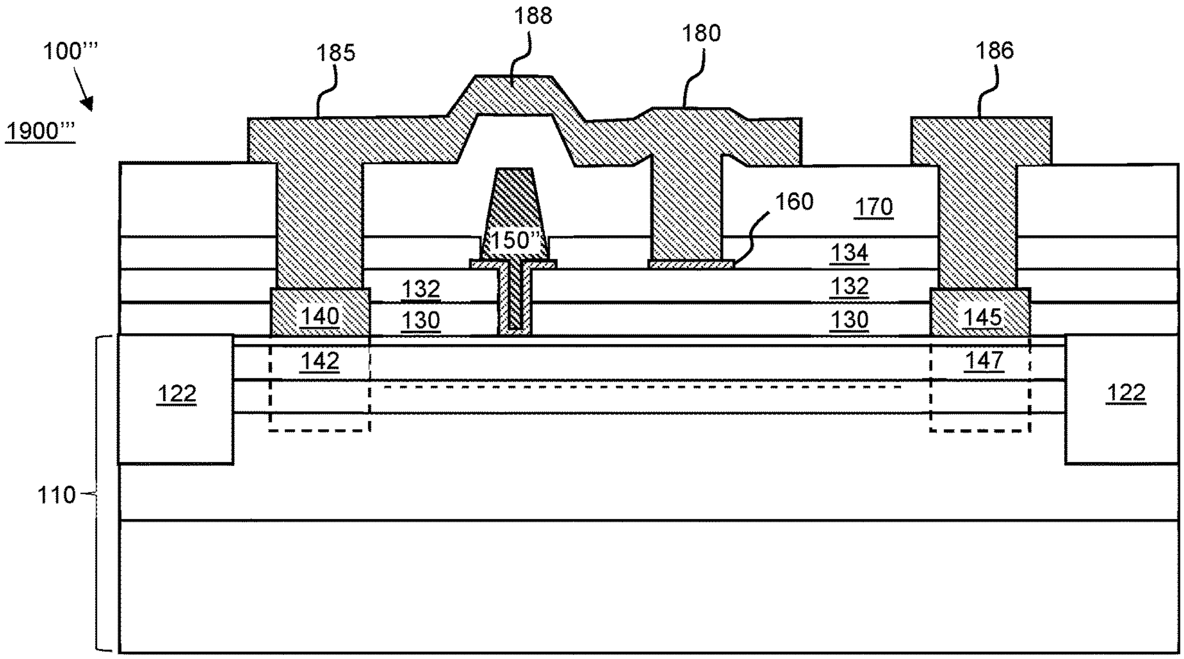

As depicted in FIG. 28, fabrication of device 100''' continues up to and including alternate fabrication stage 1900''' by forming the fourth dielectric layer 170 over the third dielectric layer 134, the source and drain electrodes 140, 145, the field plate 160, and the upper gate electrode 154" (see details of fabrication stages 1500, 1500', FIGS. 15, 22), and forming openings through the fourth dielectric layer 170 that expose the source electrode 140, the drain electrode 145, and the field plate 160 (see details of fabrication stage 1600, FIG. 16). A second conductive layer (e.g., layer 1750) is then deposited over the fourth dielectric layer 170 and into the above-described openings (see details of fabrication stage 1700, FIG. 17). The second conductive layer is then patterned, resulting in the formation of the source and drain metallization 185, 186 and the conductive connection 180 between the field plate 160 and the source metallization 185 (see details of fabrication stage 1800, FIGS. 18, 19). As mentioned previously, in some embodiments, the field plate-to-source connection 180 may include conductive straps 188, while in other embodiments, the field plate-to-source connection 180 may include a solid, continuous conductive structure between the upper field plate 162 and the source electrode 140. Because the upper gate electrode 154" has a relatively high profile, in comparison with the field plate 160, it may be desirable to have a solid field plate-to-source connection 180 over the gate 150" in order to terminate the field lines, rather than having a strapped field plate-to-source connection.

An embodiment of a semiconductor device includes a semiconductor substrate comprising an upper surface and a channel, and source and drain electrodes overlying the semiconductor substrate. One or more lower dielectric layers are disposed over the upper surface of the semiconductor substrate, and one or more intermediate dielectric layers are disposed over the one or more lower dielectric layers. The device further includes a multiple-part gate structure with lower and upper gate electrodes. The lower gate electrode is formed from a first portion of a first conductive layer, which includes a first segment that extends through a first gate opening in the one or more lower dielectric layers over the channel, and a second segment that overlies the one or more lower dielectric layers and extends from the first gate opening toward the drain electrode. The upper gate electrode is formed from a second conductive layer. The upper gate electrode extends through the one or more intermediate dielectric layers and contacts the lower gate electrode. The device further includes a lower field plate disposed between the lower gate electrode and the drain electrode. The lower field plate is formed from a second portion of the first conductive layer.

An embodiment of a method for forming a semiconductor device includes forming one or more lower dielectric layers over an upper surface of a semiconductor substrate that includes a channel, and forming source and drain electrodes over the upper surface of the semiconductor substrate. The method also includes forming a first gate opening through the one or more lower dielectric layers between the source and drain contacts, where the first gate opening extends toward the upper surface of the semiconductor substrate. A lower gate electrode and a lower field plate are simultaneously formed from a first conductive layer. The lower gate electrode includes a first segment that extends into the first gate opening, and a second segment that overlies the one or more lower dielectric layers and extends from the first gate opening toward the drain electrode. The lower field plate is disposed between the lower gate electrode and the drain electrode and overlies the one or more lower dielectric layers. The method also includes forming one or more intermediate dielectric layers over the one or more lower dielectric layers, forming a second gate opening through the one or more intermediate dielectric layers to expose the lower gate electrode, and forming an upper gate electrode on and over the lower gate electrode.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms “first,” “second” and other such numerical terms referring to structures do not imply a sequence or order unless clearly indicated by the context.

The foregoing description refers to elements or nodes or features being “connected” or “coupled” together. As used herein, unless expressly stated otherwise, “connected” means that one element is directly joined to (or directly communicates with) another element, and not necessarily mechanically. Likewise, unless expressly stated otherwise, “coupled” means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A metal-insulator-semiconductor field effect transistor (MISFET) device-comprising:
- a semiconductor substrate comprising an upper surface and a channel;
- a source electrode overlying the semiconductor substrate;
- a drain electrode overlying the semiconductor substrate;
- one or more lower dielectric layers disposed over the upper surface of the semiconductor substrate;
- one or more intermediate dielectric layers disposed over the one or more lower dielectric layers;
- a multiple-part gate structure that includes
  - a lower gate electrode formed from a first portion of a first conductive layer, wherein the first portion of the first conductive layer includes a first segment that extends through a first gate opening in the one or more lower dielectric layers over the channel, and a second segment that overlies the one or more lower dielectric layers and extends from the first gate opening toward the drain electrode, and
- an upper gate electrode formed from a second conductive layer, wherein the upper gate electrode extends through the one or more intermediate dielectric layers and contacts the lower gate electrode;
- a gate dielectric between the first segment of the lower gate electrode and the semiconductor substrate; and
- a lower field plate disposed between the lower gate electrode and the drain electrode, wherein the lower field plate is formed from a second portion of the first conductive layer.

2. A semiconductor device comprising:
- a semiconductor substrate comprising an upper surface and a channel;
- a source electrode overlying the semiconductor substrate;
- a drain electrode overlying the semiconductor substrate;
- one or more lower dielectric layers disposed over the upper surface of the semiconductor substrate;
- one or more intermediate dielectric layers disposed over the one or more lower dielectric layers;
- a multiple-part gate structure that includes a lower gate electrode formed from a first portion of a first conductive layer, wherein the first portion of the first conductive layer includes a first segment that extends through a first gate opening in the one or more lower dielectric layers over the channel, and a second segment that overlies the one or more lower dielectric layers and extends from the first gate opening toward the drain electrode, and an upper gate electrode formed from a second conductive layer, wherein the upper gate electrode extends through the one or more intermediate dielectric layers and contacts the lower gate electrode, and the upper gate electrode has a T-shaped cross-section with a stem that extends through the one or more intermediate dielectric layers to contact the lower gate electrode, and first and second protruding regions that extend over portions of the upper surface of the one or more intermediate dielectric layers; and a lower field plate disposed between the lower gate electrode and the drain electrode, wherein the lower field plate is formed from a second portion of the first conductive layer.

3. A semiconductor device comprising:

a semiconductor substrate comprising an upper surface and a channel;

a source electrode overlying the semiconductor substrate;

a drain electrode overlying the semiconductor substrate;

one or more lower dielectric layers disposed over the upper surface of the semiconductor substrate;

one or more intermediate dielectric layers disposed over the one or more lower dielectric layers;

a multiple-part gate structure that includes a lower gate electrode formed from a first portion of a first conductive layer, wherein the first portion of the first conductive layer includes a first segment that extends through a first gate opening in the one or more lower dielectric layers over the channel, and a second segment that overlies the one or more lower dielectric layers and extends from the first gate opening toward the drain electrode, and an upper gate electrode formed from a second conductive layer, wherein the upper gate electrode extends through the one or more intermediate dielectric layers and contacts the lower gate electrode;

a lower field plate disposed between the lower gate electrode and the drain electrode, wherein the lower field plate is formed from a second portion of the first conductive layer; and an upper field plate formed from the second conductive layer, wherein the upper field plate has a T-shaped cross section with a stem that extends through the one or more intermediate dielectric layers to contact the lower field plate, and first and second protruding regions that extend over portions of the upper surface of the one or more intermediate dielectric layers.

4. The semiconductor device of claim 3, wherein:

the upper field plate has a cross-sectional shape selected from a symmetrical T-shape and an asymmetrical T-shape.

5. A method for forming a semiconductor device, the method comprising:

forming one or more lower dielectric layers over an upper surface of a semiconductor substrate that includes a channel;

forming source and drain electrodes over the upper surface of the semiconductor substrate;

forming a first gate opening through the one or more lower dielectric layers between the source and drain contacts, wherein the first gate opening extends toward the upper surface of the semiconductor substrate;

simultaneously forming a lower gate electrode and a lower field plate from a first conductive layer, wherein the lower gate electrode includes a first segment that extends into the first gate opening, and a second segment that overlies the one or more lower dielectric layers and extends from the first gate opening toward the drain electrode, and wherein the lower field plate is disposed between the lower gate electrode and the drain electrode and overlies the one or more lower dielectric layers;

forming one or more intermediate dielectric layers over the one or more lower dielectric layers;

forming a second gate opening through the one or more intermediate dielectric layers to expose the lower gate electrode; and forming an upper gate electrode on and over the lower gate electrode.

6. The method of claim 5, wherein forming the one or more lower dielectric layers comprises:

forming a first dielectric layer on the upper surface of the semiconductor substrate, wherein the source and drain electrodes extend through the first dielectric layer, and forming a second dielectric layer on the first dielectric layer, wherein the second dielectric layer overlies the source and drain electrodes.

7. The method of claim 5, wherein the simultaneously forming the lower gate electrode and the lower field plate comprises:

depositing the first conductive layer over the one or more lower dielectric layers and into the first gate opening; and patterning the first conductive layer using a single photoresist mask to form the lower gate electrode and the lower field plate.

8. The method of claim 5, wherein the simultaneously forming the lower gate electrode and the lower field plate comprises:

forming a photoresist mask over the one or more lower dielectric layers, wherein the photoresist mask has a first opening that exposes the first gate opening, and a second opening over a portion of the one or more dielectric layers where the lower field plate is to be formed;

depositing the first conductive layer over the photoresist mask and into the first and second openings of the photoresist mask and into the first gate opening; and removing the photoresist mask using a lift-off process.

9. The method of claim 5, wherein the first conductive layer is formed from a metal stack of one or more Schottky materials selected from nickel, platinum, titanium, titanium nitride, tantalum nitride, copper, palladium, chromium, tungsten, iridium, and poly-silicon.

10. The method of claim 5, wherein depositing the first conductive layer comprises:

conformally depositing the first conductive layer over the one or more lower dielectric layers and into the first gate opening using atomic layer deposition.

11. The method of claim 5, wherein the forming the upper gate electrode comprises:

forming a first photoresist mask over the one or more intermediate dielectric layers, wherein the first photoresist mask has a first photoresist opening aligned over the lower gate electrode;

etching the one or more intermediate dielectric layers through the first photoresist opening to form a second gate opening through the one or more intermediate dielectric layers that exposes the lower gate electrode;

removing the first photoresist mask and forming a second photoresist mask over the one or more intermediate dielectric layers, wherein the second photoresist mask has a second photoresist opening aligned over and wider than the second gate opening;

depositing a second conductive layer over the second photoresist mask and into the second photoresist opening and the second gate opening to form the upper gate electrode with a T-shaped cross section on the lower gate electrode; and removing the second photoresist mask using a lift-off process.

12. The method of claim 5, wherein the forming the upper gate electrode comprises:

forming a photoresist mask over the one or more intermediate dielectric layers, wherein the photoresist mask has a photoresist opening aligned over the lower gate electrode;

depositing a second conductive layer over the photoresist mask and into the photoresist opening to form the upper gate electrode with a trapezoid-shaped cross section on the lower gate electrode; and removing the photoresist mask using a lift-off process.

13. The method of claim 5, further comprising:

forming an upper field plate on the lower field plate by forming a first photoresist mask over the one or more intermediate dielectric layers, wherein the first photoresist mask has a first photoresist opening aligned over the lower field plate, etching the one or more intermediate dielectric layers through the first photoresist opening to form a field plate opening through the one or more intermediate dielectric layers that exposes the lower field plate, removing the first photoresist mask and forming a second photoresist mask over the one or more intermediate dielectric layers, wherein the second photoresist mask has a second photoresist opening aligned over and wider than the field plate opening, depositing a second conductive layer over the second photoresist mask and into the second photoresist opening and the field plate opening to form the upper field plate with a T-shaped cross section on the lower field plate, and removing the second photoresist mask using a lift-off process.

14. The method of claim 5, further comprising:

forming one or more upper dielectric layers disposed over the one or more intermediate dielectric layers and over the upper gate electrode;

forming openings through at least the upper and intermediate dielectric layers over the source electrode and the field plate; and forming a conductive connection that extends over the one or more upper dielectric layers and over the upper gate electrode to electrically connect the lower field plate to the source electrode.

* * * * *